(12) United States Patent
Therrien et al.

(10) Patent No.: US 8,313,038 B2
(45) Date of Patent: Nov. 20, 2012

(54) TELECOM SHELTER COOLING AND CONTROL SYSTEM

(75) Inventors: David Therrien, North Kingstown, RI (US); Henry Riddoch, Scotland (GB)

(73) Assignee: Minebea Co., Ltd. (JP)

( * ) Notice: Subject to any disclaimer, the term of this patent is extended or adjusted under 35 U.S.C. 154(b) by 571 days.

(21) Appl. No.: 12/146,409

(22) Filed: Jun. 25, 2008

(65) Prior Publication Data

US 2009/0321039 A1    Dec. 31, 2009

(51) Int. Cl.
  F24F 7/00      (2006.01)
  B60H 1/00     (2006.01)
  F28D 15/00   (2006.01)
  F25D 23/12   (2006.01)

(52) U.S. Cl. .................. 236/49.2; 165/104.33; 165/11.1; 62/259.2

(58) Field of Classification Search ............. 165/104.14, 165/104.33, 11.1; 62/259.2; 236/49.2; 700/275; 454/184; 361/695, 696, 691, 699, 679.02, 361/679.46
See application file for complete search history.

(56) References Cited

U.S. PATENT DOCUMENTS

| | | | | |
|---|---|---|---|---|
| 5,576,739 A | * | 11/1996 | Murphy | 340/3.4 |
| 5,701,115 A | * | 12/1997 | Right et al. | 340/286.05 |
| 5,934,079 A | * | 8/1999 | Han et al. | 62/3.2 |
| 6,069,465 A | * | 5/2000 | de Boois et al. | 318/675 |
| 6,392,893 B1 | * | 5/2002 | Carney et al. | 361/727 |
| 6,720,886 B2 | * | 4/2004 | Seelbach et al. | 340/693.6 |
| 6,997,006 B2 | * | 2/2006 | Kameyama et al. | 62/259.2 |
| 7,016,193 B1 | * | 3/2006 | Jacques et al. | 361/695 |
| 7,143,724 B2 | * | 12/2006 | Hashizumi et al. | 123/41.56 |
| 2006/0192663 A1 | * | 8/2006 | Bryan et al. | 340/457.1 |
| 2008/0265808 A1 | * | 10/2008 | Sparey et al. | 318/139 |

FOREIGN PATENT DOCUMENTS

WO    WO 2006079855 A1 *    8/2006

* cited by examiner

Primary Examiner — Chen Wen Jiang
(74) Attorney, Agent, or Firm — Fountainhead Law Group P.C.

(57) ABSTRACT

A system configured to provide cooling of electronic equipment in a shelter in combination with an air conditioning (A/C) system. The system includes one or more blowers for drawing air into the shelter, a damper arrangement for controlling air exhaust. The system further includes a DC powered controller coupled to the one or more blowers, the damper arrangement, and the A/C system. The controller is configured to receive at least a first analog input signal associated with a shelter-interior temperature, a second analog input signal associated with a shelter-exterior temperature, and a plurality of alarm input signals and to generate the one or more first control signals to control blower rotational speed, the second control signal to open/close the damper arrangement, and a third control signal to inhibit/activate the A/C system based on at least the first analog input signal, or the second analog input signal, or a plurality of alarm input signals, or a combination of these.

16 Claims, 14 Drawing Sheets

TELECOM SHELTER COOLING AND CONTROL SYSTEM

BACKGROUND OF THE INVENTION

The present invention relates generally to system cooling techniques. In particular, embodiments of the present invention provide a method and system for providing an alternate cooling to an outdoor shelter housing electrical equipment. Merely by way of example, the invention has been applied to telecommunications shelters, but it would be recognized that the invention has a much broader range of applicability.

Telecommunication (telecom) shelters are typically constructed as an outdoor facility in either steel or pre-cast concrete structure for housing an electrical system. Physical dimensions for such shelters are about 20 ft in length, 10 ft in width, 10 ft in height with an access door and several access hatches for cable access. These shelters are usually attached to split system air-conditioning units for providing cooling for the electrical system therein. A conventional air conditioning (A/C) system associated with the shelter is typically powered from standard Alternating Current (AC) power supply and hence only operates and provides cooling as long as there is AC power available.

However, the electrical system within the telecom shelter usually needs to operate from a Direct Current (DC) voltage converted from the AC input by one or more DC power supplies disposed inside the shelter. This DC voltage is typically +24 VDC or −48 VDC and there are typically banks of batteries provided in the shelter to store this DC Power. The batteries are installed so that the systems can operate during events where the AC power is interrupted to the shelter. Cooling for outdoor telecom shelters is critical for proper operation of the electronics housed therein. Typically the telecom equipment installed in the shelters has an over-temperature shutdown monitor built into the equipment. Thus, the time that the telecom systems can operate is not limited by the battery life, but is limited by the time that the system can operate before it reaches the over-temperature shutdown threshold when the A/C system for providing cooling to the shelter is no longer functioning. This time depends on the external ambient conditions but is typically quite short ( approx 20 minutes to 1 hour) for conventional telecom shelter. One potential solution is to use a DC to AC inverter in the event of a standard AC power failure. However, this is considered to be not practical, because it would require a very large battery storage capability.

In conditions where a large amount of the telecom shelters lose power at the same time (such as in a hurricane event), the telecom equipment installed in the shelter is not available for subsequent rescue efforts. If cellular phone systems are used to communicate, 20 minutes is not enough time to restore power to so many systems. Due to a recent event that caused a sustained lack of communication (hurricane Katrina), the federal regulations have been changed. Telecom shelters are now required to operate for 4-8 hours after loss of standard AC power.

Therefore, an alternate system and method for providing cooling to the outdoor shelter of electrical equipment are desired.

BRIEF SUMMARY OF THE INVENTION

The present invention relates generally to system cooling techniques. In particular, embodiments of the present invention provide a method and system for providing an alternate cooling to an outdoor shelter with telecom equipment installed therein.

Embodiments according to the invention lead to a system configured to provide controlled cooling of electronic equipment in an outdoor shelter in combination with an air conditioning (A/C) system powered by AC power supply. The electronic equipment is powered by a DC supply. The system includes one or more blowers configured to be mounted to the outdoor shelter to draw exterior air into the outdoor shelter. Additionally, the system includes a damper arrangement configured to be mounted at an air exhaust region of the outdoor shelter. Moreover, the system includes a controller powered by the DC supply and coupled to the one or more blowers, the damper arrangement, and the A/C system. The controller is configured to receive at least a first analog input signal associated with a shelter-interior temperature, a second analog input signal associated with a shelter-exterior temperature, and a plurality of alarm input signals. The controller is further configured to generate the one or more first control signals, the second control signal, and a third control signal based on at least the first analog input signal, or the second analog input signal, or a plurality of alarm input signals, or a combination of thereof. In one embodiment, the one or more first control signals respectively control an on/off operating state of the one or more blowers including rotational speeds of the one or more blowers. The second control signal controls opening and closing of the damper arrangement in correspondence of the on/off operating state of the one or more blowers. The third control signal inhibits/activates the A/C system.

In an alternative embodiment, the present invention leads to a system for providing alternative cooling, in addition to an air conditioning (A/C) system, to a cabinet housing electrical equipment. The system includes a blower subsystem including one or more blowers for drawing air into the cabinet. The system further includes a damper subsystem including a louver arrangement for controlling air exhaust. Additionally, the system includes a controller operated from a DC supply. The controller includes a microprocessor having at least a first analog input, a second analog input, a plurality of alarm inputs, one or more first control outputs, a second control output, and a third control output. The first analog input connects to a first thermistor to measure a first temperature inside the cabinet. The second analog input connects to a second thermistor to measure a second temperature outside the cabinet. The third control output connects to the A/C system for inhibiting or re-activating the A/C system based on at least the first temperature and the second temperature. The one or more first control outputs connect to the blower subsystem for respectively operating the one or more blowers based on at least the first temperature when the A/C system is inhibited or stopped for any reason. The second control output connects to the damper subsystem for opening/closing the louver arrangement when the one or more blowers are operating/stopped.

In another alternative embodiment, the present invention provides a method for providing an alternative cooling in addition to an air conditioning (A/C) system to a cabinet housing electrical equipment. The method includes providing a cooling system to the cabinet. The cooling system includes a blower subsystem including one or more blowers for drawing air into the cabinet and a damper subsystem including a louver arrangement for controlling air exhaust. Additionally, the cooling system includes a controller operated from a DC supply. The controller includes a microprocessor having at least a first analog input, a second analog input, a plurality of alarm inputs, one or more first control outputs, a second control output, and a third control output. The method further includes activating the controller by starting up power from the DC supply. Additionally, the method includes receiving information associated with an interior temperature from the first analog input and information associated with an exterior temperature from the second analog input and monitoring information associated with a general alarm and a plurality of specific alarms received through the plurality alarm inputs. Moreover, the microprocessor processes information associated with the exterior temperature and information associated with a general alarm and a plurality of specific alarms. If the exterior temperature is lower than a predetermined value, or no general alarm or one of the plurality of specific alarms is triggered, the microprocessor processes information associated with the interior temperature.

If a first criterion based on information associated with the interior temperature is satisfied, then the method includes a process of inhibiting the A/C system through the third control output. The method also includes another process of operating each of the one or more blowers, respectively through the one or more first control outputs, at a rotation speed depending on the information associated with the interior temperature. The method further includes a process of closing/opening the louver arrangement through the second control output when the rotation speed is/isn't zero.

If a second criterion based on information associated with the interior temperature is satisfied, then the method includes a process of activating the A/C system in cooling mode through the third control output and a process of stopping the one or more blowers through the one or more first control outputs.

If a third criterion based on information associated with the interior temperature is satisfied, then the method includes a process of activating the A/C system in heating mode through the third control output and a process of stopping the one or more blowers through the one or more first control outputs.

Many benefits are achieved by way of the present invention over conventional techniques. For example, embodiments of the present invention provide an alternate cooling system in place of conventional air conditioning system, which can be used for cooling outdoor shelter housing electrical equipment in the events where standard AC power is interrupted or failed. Certain embodiments of the present invention significantly reduces energy use and operation costs of the telecommunication shelter. Some embodiments further provide sustained operation of the communication electronics within the shelter in the event of a power failure during hurricane or earthquake. Under updated field application requirement for 4-8 hours after loss of power, the exiting telecom shelter can be kept for using with minimum amount of modification and installation of the direct air cooling system based on present invention. Further, some embodiments of the present invention provide additional cooling system redundancy for providing controlled cooling in response to various alarming situations. For example, in the event of an excess hydrogen alarm event, the system according to an embodiment of the present invention also serves to accelerate exhausting of the shelter. Or in the event of detecting fire-related smoke inside the shelter, the system according to an embodiment of the present invention can has a function to starve the fire by closing the oxygen supply. Depending upon the embodiment, one or more of these benefits, as well as other benefits, may be achieved. These and other benefits will be described in more detail throughout the present specification and more particularly below in conjunction with the following drawings.

DETAILED DESCRIPTION OF THE INVENTION

The present invention relates generally to system cooling techniques. In particular, embodiments of the present invention provide a method and system for providing an alternate cooling to an outdoor shelter housing electrical equipment. Merely by way of example, the invention has been applied to a telecommunication shelter, but it would be recognized that the invention has a much broader range of applicability.

Figure 1:
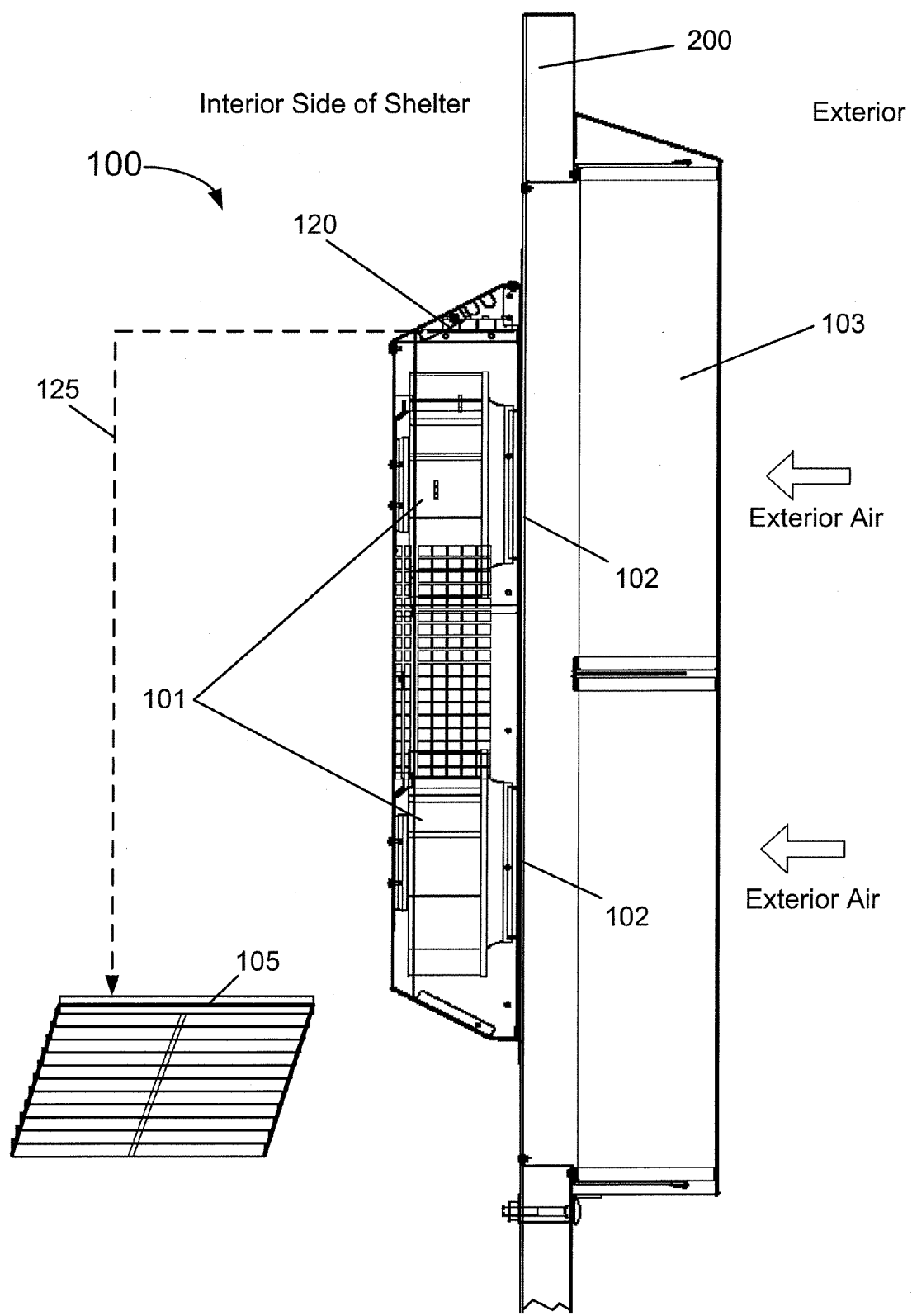
FIG. 1 is a schematic diagram showing a side view of a cooling system according to an embodiment of the present invention.

FIG. 1 is a schematic diagram showing a side view of a cooling system according to an embodiment of the present invention. This diagram is merely an illustration and should not limit the scope of the claims herein. One of skilled in the art should recognize many alternatives, variations, and modifications. As shown in one implementation, a direct air cooling system 100 is structured to be mounted on a position of a shelter door 200 (side view is shown). At least partially, the direct air cooling system 100, or simply called the cooling system, includes one or more blowers 101 disposed at an interior side of the shelter door 200 opposing a filter arrangement 103 at an exterior side of the shelter door 200. In one embodiment, the one or more blowers are fan trays structured as two channels, each with two blowers. In particular, each blower can be a DC powered radial blower. For example, in a specific implementation a NMB 48V 225 mm radial blower can be used (NMB Part No. 225R103 D0801). The filter arrangement 103 is configured to cover the air inlet region 102 of the one or more blowers 101 for the purpose of removing dust and moisture from the air as it is drawn into the shelter by the one or more blowers 101. As shown, the cooling system 100 is incorporated with a damper arrangement 105 including a plurality of louver blades that are electrically operated to an open position or close position to control the flow of air exhaust. Though the plurality of louver blades are shown to be oriented in horizontal direction, they can be implemented in other orientations. In one embodiment, the damper arrangement 105 is configured to be mounted at a location where air is exhausted from within the shelter. This location can be elsewhere on the shelter other than the same position where the one or more blowers 101 are mounted. For example, a cable duct region can utilized for installing the damper arrangement 105.

Additionally, the cooling system 100 includes a microprocessor-based controller 120 disposed within a same enclosure that houses the one or more blowers 101. In certain embodiments, the controller 120 is configured to send one or more control signals to operate the one or more blowers 101 when an existing air conditioning (A/C) system (not shown) for the shelter is optionally inhibited (by the same controller 120) or stopped subjecting to power failure or other electrical or mechanical faults. In some embodiments, the controller 120 also is configured to send a control signal through connection 125 to the damper arrangement 105 to open or close the plurality of louver blades. In a specific embodiment, the one or more blowers 101 are configured to draw in cool exterior air into the shelter for cooling the electrical equipment therein. Accordingly, the damper arrangement 105 is operated to an open position to allow heated air to exhaust out of the shelter when the one or more blowers 101 are operating, and can be closed to seal the shelter when the one or more blowers are not operating. In another specific embodiment, the damper arrangement 105 can have a spring return feature that allows it to be open when DC power is on and automatically closed when power is removed for any reason.

Figure 2:
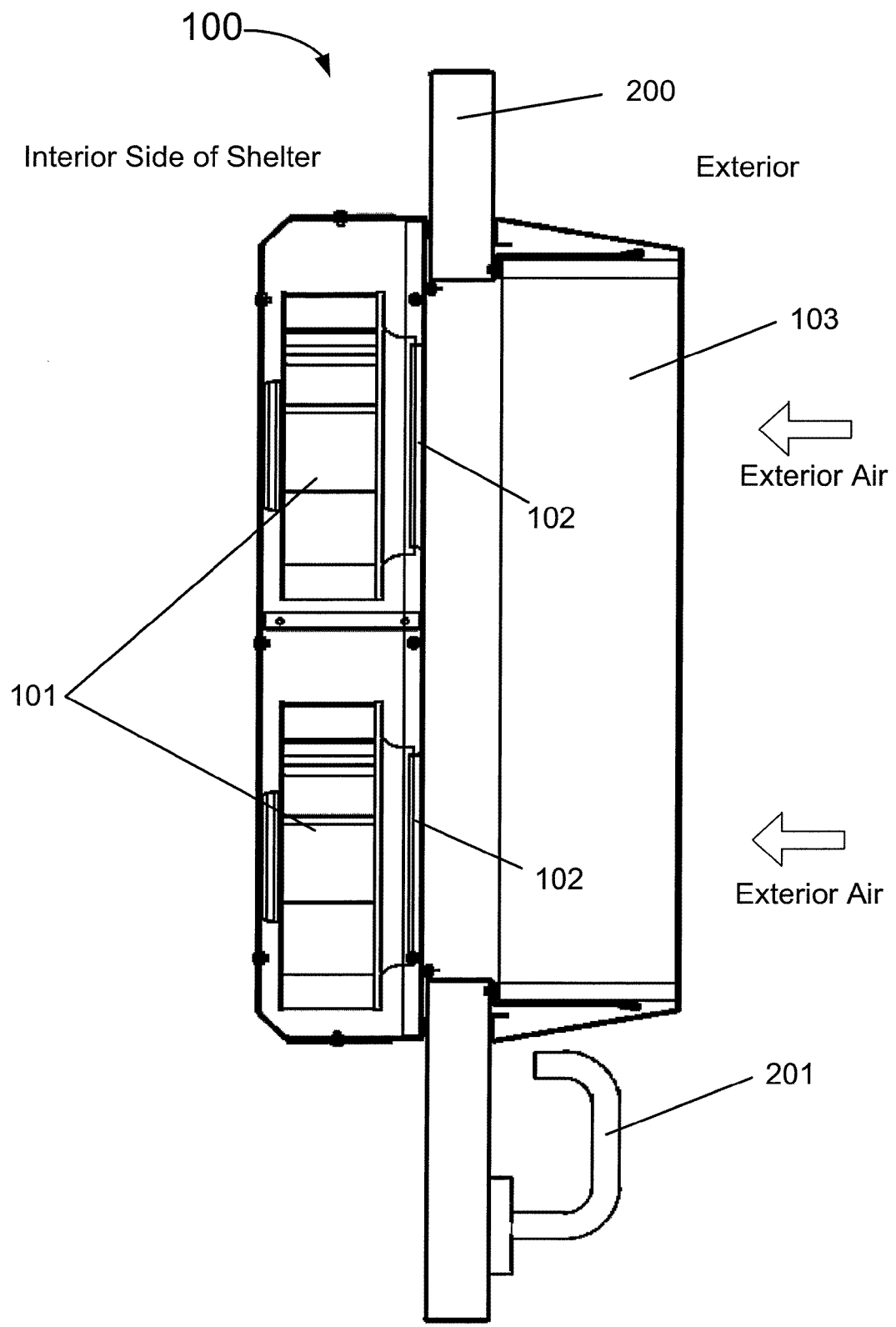
FIG. 2 is a schematic diagram showing the top view of a cooling system according to the embodiment of the present invention.

FIG. 2 is a schematic diagram showing a top view of the cooling system 100 according to an embodiment of the present invention. This diagram is merely an illustration and should not limit the scope of the claims herein. One of skilled in the art should recognize many alternatives, variations, and modifications. As shown, the direct air cooling system 100 mounted on the shelter door 200 is viewed from top of the door looking down. On the exterior side of the door, now a door handle 201 can be seen. Similar to FIG. 1, the one or more blowers 101 and the filter arrangement 103 are respectively disposed on interior side and exterior side of the shelter door 200.

In a specific embodiment, the controller 120 of the direct air cooling system 100 is coupled to one or more temperature measuring devices. The one or more temperature measuring devices include at least a first thermistor for measuring a shelter-interior temperature and a second thermistor for measuring a shelter-exterior temperature. For example, though not explicitly shown in FIG. 1 or FIG. 2, the first thermistor can be installed next to the one or more blowers 101 at the interior side of the shelter door 200, and the second thermistor may be installed outside the shelter door 200 near the filter arrangement 103. Correspondingly, the controller 120 is able to receive at least a first analog input signal indicative to the shelter-interior temperature and a second analog input signal indicative to the shelter-exterior temperature. The controller is configured to generate control output signals based on at least the first analog input signal and the second analog input signal for controlling the one or more blowers 101 as well as the damper arrangement 105 with options of inhibiting/activating the A/C system. In one example, if the exterior temperature is too high (exceeding a predetermined value) then the direct air cooling system 100 may be turned off while the A/C system can be activated to providing adequate cooling for the shelter in traditional manner.

Figure 4:
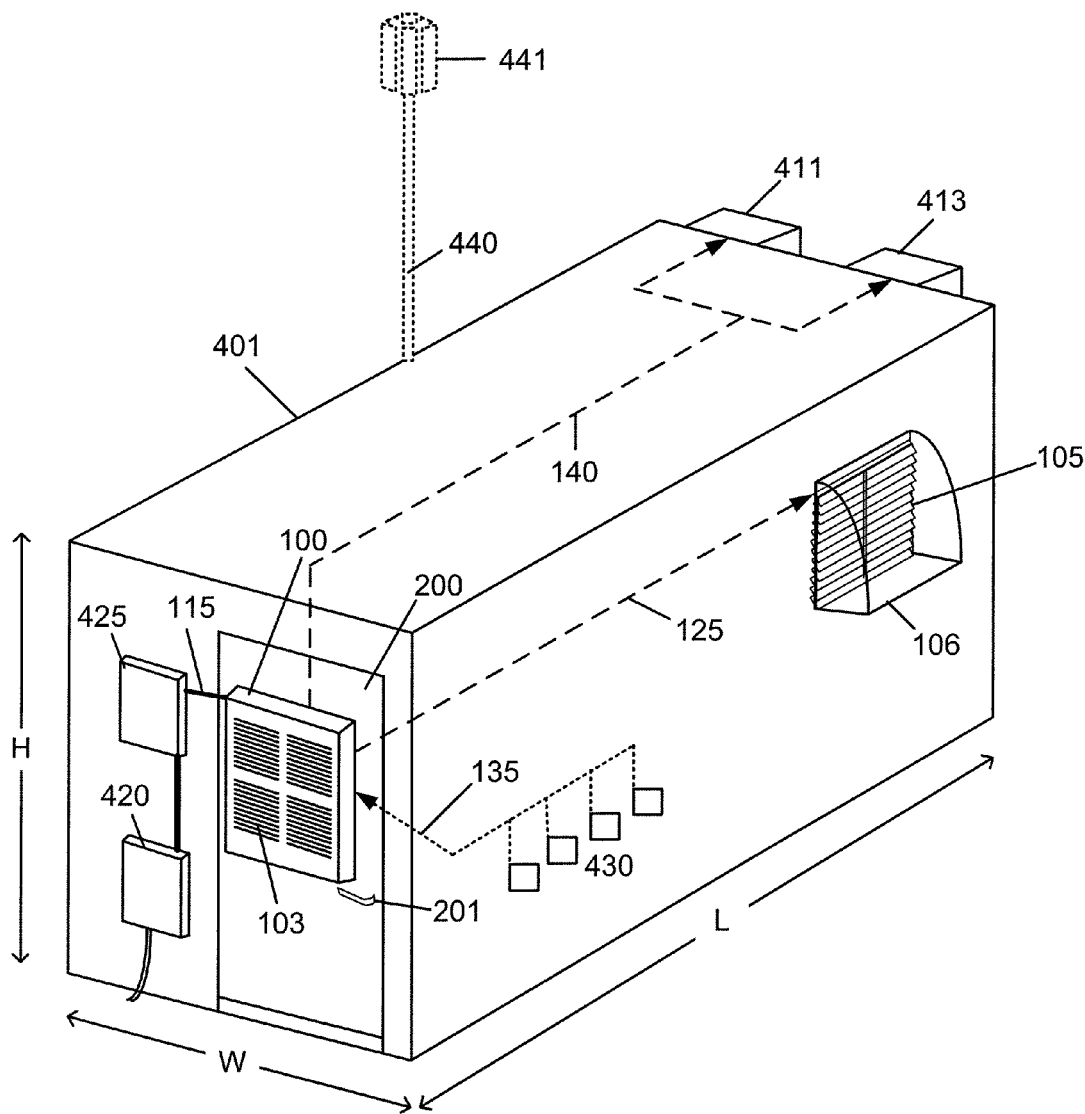
FIG. 4 is schematic diagram showing a telecom shelter with a direct air cooling system according to embodiments of present invention in addition to a traditional air conditioning system.

In another specific embodiment, the controller 120 further is coupled with a plurality of sensing devices disposed at various locations of the shelter (schematically shown in FIG. 4 below) and a plurality of alarm output devices disposed on-board (schematically shown in FIG. 5B below). Examples of the plurality of sensing devices includes a smoke sensor, a hydrogen sensor, a pressure sensor, one or more voltage sensors (e.g., AC power monitoring module and DC supply voltage monitor), a pressure sensor, and others for detecting various environmental and operational conditions. The controller 120 is configured to receive and process a plurality of alarm input signals from the plurality of sensing devices and output a plurality of alarm output signals through the plurality of alarm output devices. The plurality of alarm output devices include on-board contact relays and alarm display devices. For example, Form C contact relay is used. In certain implementation, the alarm display devices include several LEDs which use light color, single color or bi-color, to indicate normal or certain alarm condition. In addition to the analog input signals associated to the interior/exterior temperature, the controller 120 also is configured to modify the control signals for the one or more blowers 101, the damper arrangement 105, and the A/C system based on specific alarm input signal received.

Figure 3A:
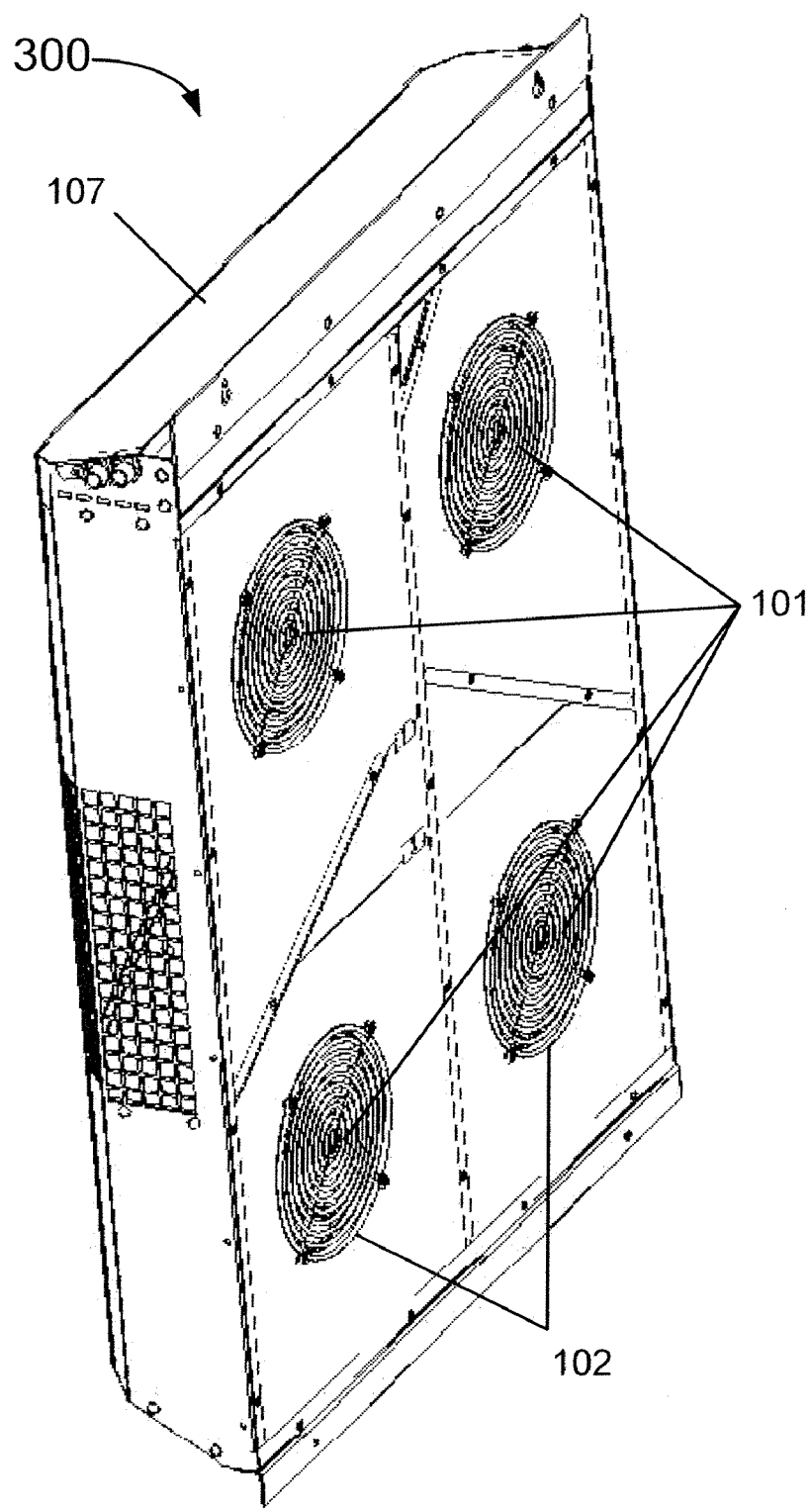
FIGS. 3A and 3B are simplified diagrams showing a blower subsystem including four blowers and a controller according to an embodiment of the present invention.
Figure 3B:
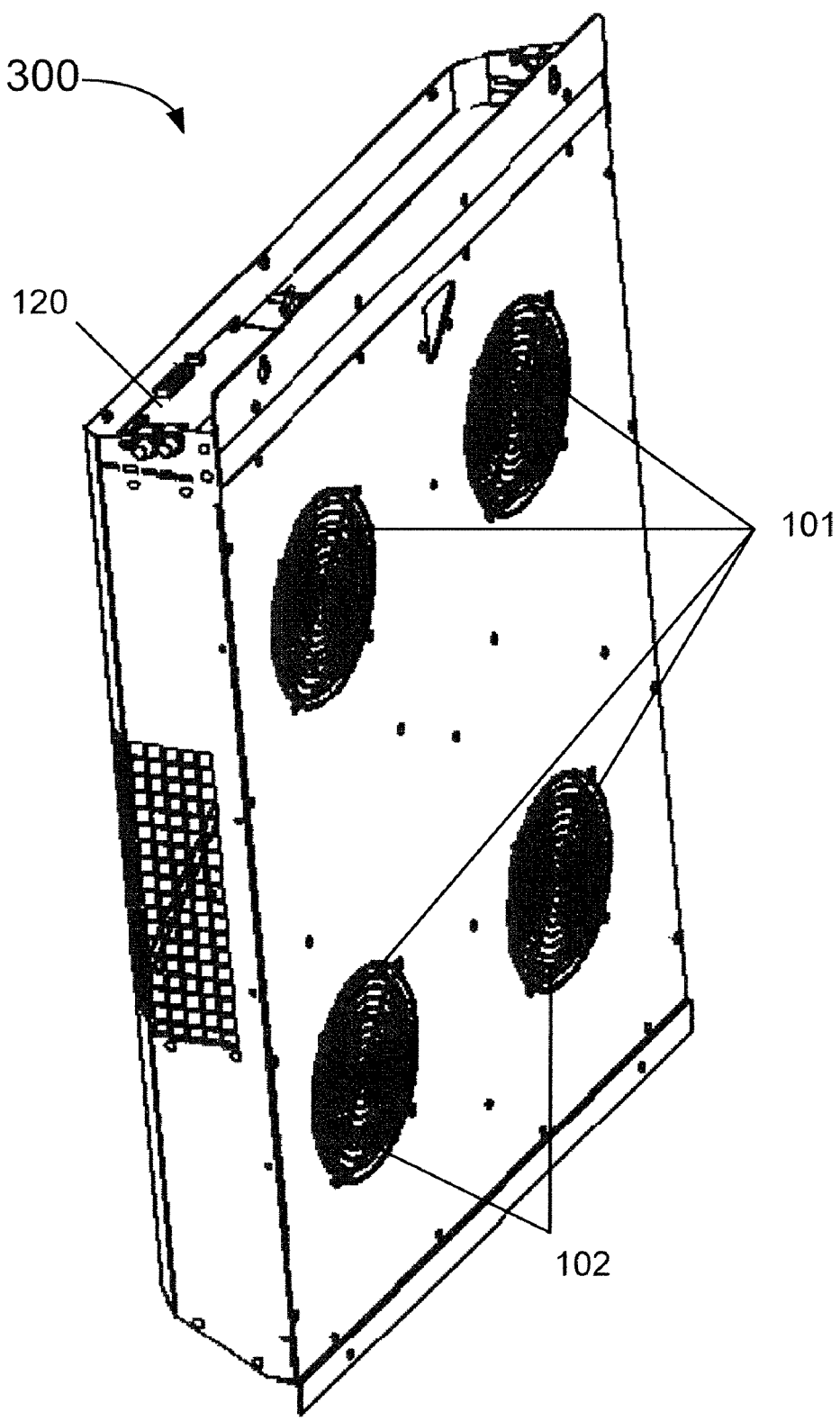

FIGS. 3A and 3B are simplified diagrams showing a blower subsystem including four blowers and a controller according to an embodiment of the present invention. These diagrams are merely illustrations and should not limit the scope of the claims herein. One of skilled in the art should recognize many alternatives, variations, and modifications. As shown, the blower subsystem 300 includes four blowers 101 installed within an enclosure made of a sheet metal structure 107. Each blower 101 is disposed behind an air inlet region 102 facing exterior side when the blower system is mounted to a shelter. In one embodiment, the four blowers 101 are powered by a DC supply (e.g., as shown in FIG. 4 below) and used to draw the cool exterior air into the shelter, taking out the heat generated from the operating telecom equipment through an exhaust region. The DC supply for the blower subsystem can be the same DC supply conventionally provided for the equipment within the shelter or a separate DC supply. For example, the DC supply can be an AC-to-DC inverter, or a battery, a rechargeable battery, a fuel cell, or a solar cell, and others. In the event of a power failure, these blowers 101 can continue to operate normally from the battery back up system of the DC supply, which allows the entire shelter to operate as long as there is enough power in the batteries.

In a specific embodiment, each blower 101 can be a DC powered radial blower. For example, in a specific implementation a NMB 48V 225 mm radial blower can be used (NMB Part No. 225R103 D0801). In one example, the four blowers 101 are configured into two channels, each channel has two blowers under closed-loop speed control by the controller 120. The controller 120 can be seen in the blower subsystem 300 in FIG. 3B where one side panel of the sheet metal structure 107 is removed. In a particular implementation, the controller 120 uses a pulse width modulated (PWM) speed control signal to control blower rotation speed by monitoring tachometer signals obtained from each radial blower in response to one or more speed control input signals. More detail about a control method of the direct air cooling system in combination with an existing air conditioning system to provide cooling for the outdoor telecom shelter can be found in following paragraphs.

FIG. 4 is schematic diagram showing a telecom shelter with a direct air cooling system according to embodiments of present invention in addition to a traditional air conditioning system. This diagram is merely an illustration and should not limit the scope of the claims herein. One of skilled in the art should recognize many alternatives, variations, and modifications. As shown, in a perspective view a telecom shelter 401 is an outdoor structure with a length L, a width W, and a height H that houses electric equipment for telecommunications. In one application, the electric equipment in the telecom shelter 401 comprises all user equipment and software needed for communication with a wireless telephone network. As shown, optionally an antenna 431 is disposed above the telecom shelter on a top part of a mast 430 for signal transmission or reception. The shelter 401 itself can be made from a precast concrete structure or from a steel structure. In one example, the length L is about 20 ft and the width and height each about 10 ft. In another example, the shelter can be used for housing equipment for many alternate applications other than telecommunication.

The telecom shelter 401 includes an access door 200 built on one side. In one embodiment, a direct air cooling system 100 is mounted on the access door 200 in a manner the same as one shown in FIG. 1 and FIG. 2, and a filter arrangement 103 is at least partially visible from exterior side of the shelter door 200. The direct air cooling system 100 has a blower subsystem including one or more blowers disposed at the interior side of the shelter door 200, which are not directly visible in FIG. 4. Of course, the blower subsystem of the direct air cooling system 100 can be mounted on any other side or position of the shelter 401. On an alternative side of the shelter 401, an existing air conditioning (A/C) system including two independent working units 411 and 413 have been installed. The A/C system 411 and 413 are usually powered by standard AC power supply connected to a power grid through a cable box 420. In one embodiment, the telecom shelter 401 also includes an AC-DC inverter 425 to transform the AC power into a nominal −48V standard DC power (with −36V to −60V range) which is normally used for operating telecommunication equipment within the telecom shelter 401. In another embodiment, the AC power can be transformed into a nominal +24V standard DC power (with 19V to 29V range) which can be used for operating various telecommunications equipment and the like. An electrical connection 115 links the AC-DC inverter 425 to the direct air cooling system 100 to deliver DC power for its operation and control functions. In certain implementation, a separate DC supply can be used for the direct air cooling system 100. For example, the DC supply can be a battery, a rechargeable battery, a fuel cell, or a solar cell, and others.

Referring to FIG. 4 again, on a side of the telecom shelter 401 a damper subsystem 105 can be mounted over an air outlet or exhaust region, which is coupled to the blower subsystem (e.g., the blower subsystem 300 shown in FIG. 3A, including filter arrangement) through another electrical connection 125. In another embodiment, the damper subsystem 105 is powered by one of several on-board DC power supplies (e.g., a +24V supply shown in FIG. 5A below) built on a controller through DC-DC converters from the DC supply mentioned above. As shown, the damper subsystem 105 includes a plurality of louver blades that are electrically actuated to open to allow air exhausting when the blowers of the direct air cooling system 100 is operating or to close to seal the shelter 401 when the blowers of the direct air cooling system 100 is not operating. Other types of damper arrangements other than horizontal orientated louvers can be implemented. One of skilled in the art should recognize many alternatives, variations, and modifications. In one example, the damper subsystem 105 is configured to be mounted over a cable duct in order to allow the field upgrade of the telecom shelter without affecting the structural integrity while providing a minimally invasive rework event. In a particular implementation, a wind driven rain hood 106 is mounted on the exterior side of the damper subsystem 105.

The direct air cooling system 100 described above is designed to withstand harsh outdoor environmental conditions. In particular, the direct air cooling system, or simply the cooling system, should not suffer damage when mounted to a shelter and exposed to temperatures in the range of about −45 Deg C. to about +85 Deg C. The cooling system itself should be operational within a temperature range between about −40 Deg C. and about +50 Deg C. Additionally, the system is designed to withstand certain external vibrations. For example, the cooling system should not suffer any damage and be able to continue operating when it is subjected to the following vibration conditions. 1) Random vibration during operating: for 20 minutes along all each of three axes sustain axial vibration force with a vibration intensity of 0.0001 $g^2$/Hz within a frequency range from 5 to 350 Hz and a vibration intensity dropped from its maximum in a rate of −6 dB/octave within a frequency range of 350 to 500 Hz. 2) Random vibration for survival: for 20 minutes along all each of three axes sustain axial vibration force with a vibration intensity of 0.015 $g^2$/Hz within a frequency range from 3 to 100 Hz and a vibration intensity dropped from its maximum in a rate of −6 dB/octave within a frequency range of 100 to 137 Hz, and a vibration intensity of 0.008 $g^2$/Hz within a frequency range from 137 to 350 Hz and a vibration intensity dropped from its maximum in a rate of −6 dB/octave within a frequency range of 350 to 500 Hz. 3) Swept sine vibration for survival: 0.5 g acceleration (from 0 to peak) within a frequency variation from 3 to 500 and to 3 Hz. The test is for resonant search along all three axes with 15 minutes dwell at all resonances and with 1 octave/minute sweep rate. Furthermore, the cooling system should withstand certain shock test. For example, the system should not suffer any damage when subjected to the following test: a half sine shock test with duration less than 3 milliseconds and a speed difference of about 1.65 meters per second. The shock test should be conducted minimum 3 times on each of 6 faces of the system. Moreover, the cooling system is designed to meet regulatory requirement of UL/EN 60950. More detail about a control method of the direct air cooling system using one or more DC operated blowers in association with a damper arrangement to provide controlled cooling for the outdoor telecom shelter can be found in following paragraphs.

Figure 5A:
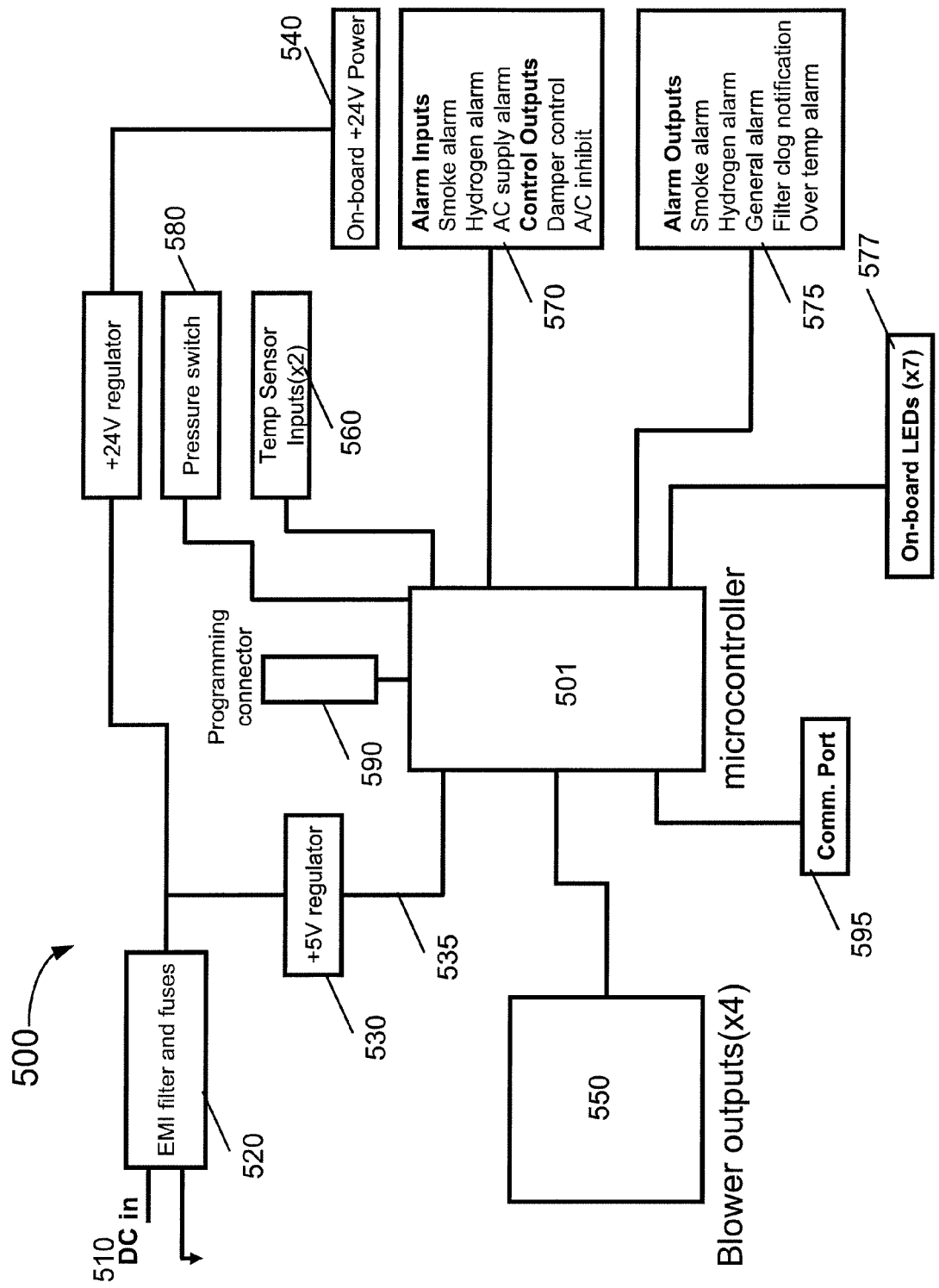
FIG. 5A is a controller functional block diagram according to an embodiment of the present invention.
Figure 5B:
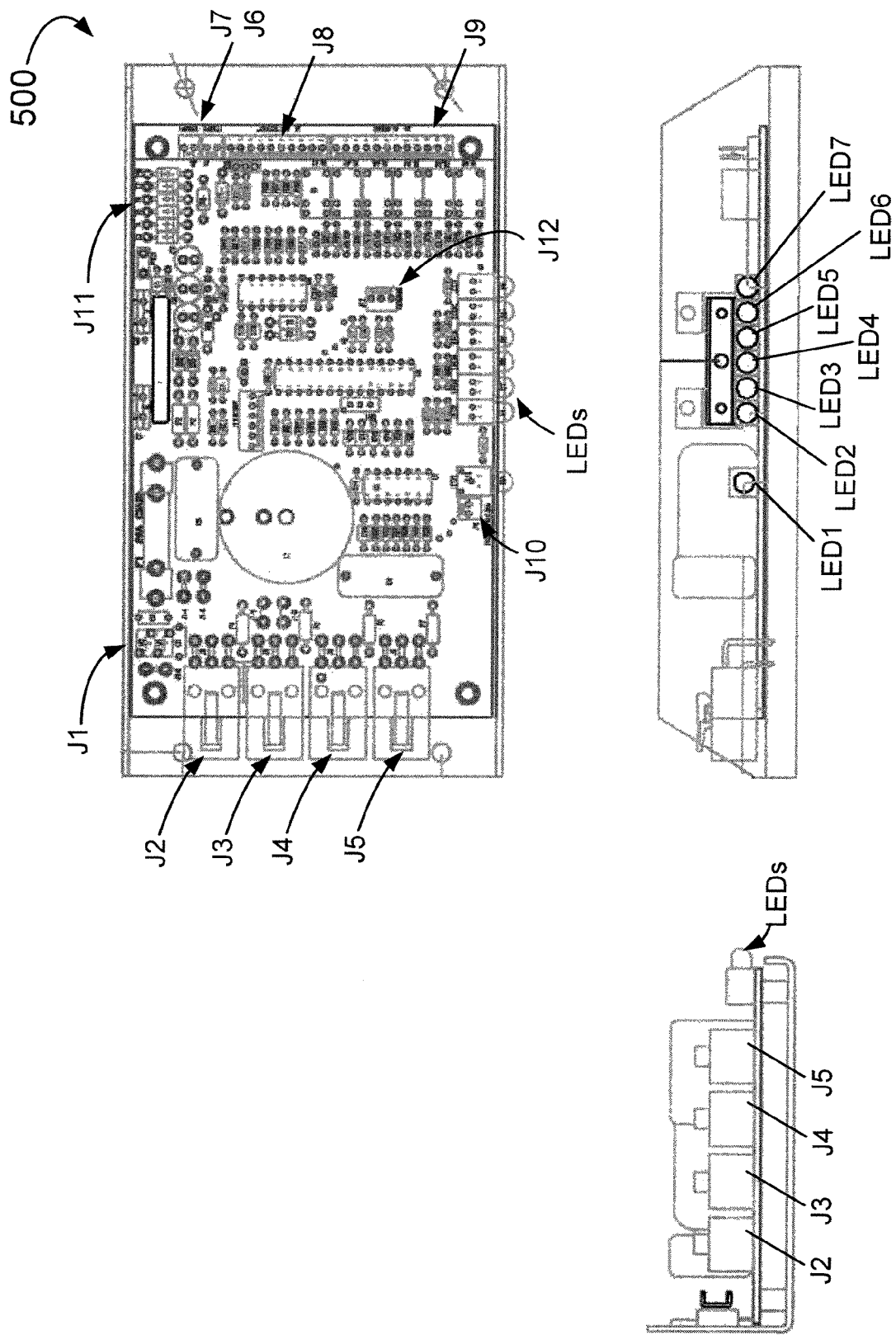
FIG. 5B shows three-angle views of the controller built on a PC board according to an embodiment of the present invention.

FIG. 5A is a controller functional block diagram according to an embodiment of the present invention. This diagram is merely an illustration and should not limit the scope of the claims herein. One of skilled in the art should recognize many alternatives, variations, and modifications. As shown, the controller 500 includes a microprocessor 501 operated by DC power delivered through a power input port 510. The controller 500 is designed to monitor the external and internal environment of the telecom shelter and control one or more blowers or motorized impellers to draw cold air from exterior to cool the interior operating equipment. In one implementation of the invention, the controller 500 is the controller 120 installed with the direct air cooling system 100. The DC supply is in a range of −36 to −60 VDC normally found for telecommunication equipment. Subsequently, the power input 510 to the controller 500 is first coupled through an Electromagnetic Compatibility (EMC) filter 520. Fuses included in the EMC filter 520 can be rated at about 20 Amps. The EMC filter 520 is supplement to a corresponding EMC filter fitted in each of the one or more blowers. The EMC filter 520 can limit the conduction of controller noise and motor noise to the system. In one example, the EMC filter 520 is designed to provide sufficient attenuation to meet the CE requirements for most applications. In one embodiment, the EMC filter design is dependent on the type of motor used for the one or more blowers and their installation locations. The design performance can only be confirmed in the specific final application.

In one embodiment, the controller 500 includes function to monitor the DC supply voltage. In one example, the interface of the power input 510 is via a connector J1 which has 5 pins J1-1 through J1-5 shown in Table 1. As shown, connector pins J1-1 and J1-2 a connected for 0 V Return signal. Connector pin J1-3 is for chassis ground. Connector pins J1-4 and J1-5 are connected for −DC voltage supply. The connector can be ¼ PCB mounted "Faston" Blade Terminals. For example, a power connector with AMP Part No 62409-1 can be used.

TABLE 1

| Connector Ref | Function | Signal type |
|---|---|---|
| J1-1 | 0 V A | 0 V Return |
| J1-2 | 0 V A | 0 V Return |
| J1-3 | Ground | Chassis Ground |
| J1-4 | −Ve Supply | −DC supply |
| J1-5 | −Ve supply | −DC supply |

Additionally, the controller 500 incorporates its own on-board DC power supplies including a +24V supply 540, +10.5V supply, and a +5V supply 530. The +24V power supply 540 is to generate the necessary power for the smoke alarm, the hydrogen alarm and the operation of damper arrangement. The +10.5V supply is for generating the PWM speed control signals and for energizing relays. Another on-board +5V supply 530 is directly coupled to the microprocessor 501 via a connection 535 for logic supply required by the microprocessor 501.

The microprocessor 501 is configured to directly couple with one or more blowers through one or more blower output ports 550. In one implementation, the controller 500 is designed to control variable speed blowers and deliver DC power to up to four motorized impellers which are controlled in two channels of two blowers dependent on the profile information programmed into the microprocessor 501. Each blower output 550 can be individually fused to prevent a single blower failure pulling the whole system down. The DC voltage supplied to these blowers is the same voltage supplied from the DC input 510 less any volt drop in the EMC filter 520. The interface associated with each of these blower output ports between the microprocessor 501 and each of the blowers can be via a 6-way connector. For example, 4 connectors, named as J2 through J5, are respectively used for four DC-driven radial blowers. Table 2 shows an example of the pin layout for the connector J2 though J5. For example, a Molex Minifit Jnr Right angle PCB mounted connector (Molex Part No. 39-30-0060) can be used.

TABLE 2

| Connector Ref | Function | Signal type (on Controller) |
|---|---|---|
| Pin 1 | No Connection | |
| Pin 2 | 0 V Return | +DC Supply to blowers |
| Pin 3 | Speed Control | PWM Logic Signal to blower |
| Pin 4 | Ground | Chassis Ground connection |
| Pin 5 | Tacho | Logic Signal from blower |
| Pin 6 | −48 V Supply | −DC Supply to blowers |

Referring to FIG. 5A, the controller 500 includes two temperature sensor inputs 560 coupled to the microprocessor 501. Physically, each of the two temperature sensor inputs 560 is coupled to a thermistor to transfer information about either a shelter-interior temperature or a shelter-exterior temperature to the microprocessor 501 via one of two interface connectors J6 and J7. In particular, the controller 500 continuously monitors an analog voltage input from the corresponding thermistor. If the analog voltage input represents a temperature of less than −43 Degrees of Centigrade, then the controller considers that the thermistor is short circuited. If the analog voltage input represents a temperature of +85 Degrees of Centigrade and above, the controller then considers the thermistor to be open circuited. In either event, the controller 500 will trigger a thermistor alarm. Of course, the specific values of those temperature limits can be custom defined. The interface between the thermistors 560 and the microprocessor 501 can be via a following connector pinout shown in Table 3. For example, each of the J6 and J7 connector can be a 2 way Molex KK Type 2.54 mm pitch header with friction lock connector (Molex Part No. 22-23-2021) can be used.

TABLE 3

| Connector Ref | Function | Signal type (on Controller) |
|---|---|---|
| Pin 1 | Signal return | Thermistor connection |
| Pin 2 | Signal out | Logic +5 V |

Referring again to FIG. 5A, the controller 500 also has several alarm input and control output ports 570 coupled to the microprocessor 501. The alarm input ports are used for coupling with a plurality of sensing devices and the control output ports include at least one output for controlling a damper arrangement and another output for inhibit an A/C system. Example of the plurality of sensing devices used here includes a smoke sensor, a hydrogen sensor, and one or more AC power monitoring modules. Correspondingly, in certain alarming condition one or more alarm input signals can be generated by one or more sensing devices and sent via the alarm input ports to the microprocessor 501. In one implementation, the alarm input port is configured to be an isolated contact relay which is closed when alarming (e.g., when detecting smoke or excess hydrogen in shelter). A +24V on-board DC supply 540 is used to provide DC power through one output port for the smoke sensor, the hydrogen sensor, and a damper actuator. This output is capable of delivering a maximum power of 450 mA at 24V and is protected against short circuit by a PTC (Polyswitch automatically resetting fuse element). A +24V switched output control signal can be provided through another output port to the damper arrangement for operating the exhaust damper to open or close. The power associated with the damper switching control is about 350 mA. The AC power monitoring module is used by the system to monitor the AC power delivered to an air conditioning (A/C) system originally associated with the telecom shelter. For example, the AC power monitoring module monitors power outputs from two circuit breakers supplying AC power to two A/C units. Two input signals associated with the AC power monitoring module are generated from corresponding two alarm input ports with isolated contacts. Each isolated contact has a relay coil energized to have open contact in normal mode and closed contact when alarming (detecting AC power supply failure/interruption). Moreover, the controller 500 includes a Form C contact output for inhibiting/activating the A/C system. The relay coil associated with this output port is configured to be energized when the A/C system is inhibited or disabled. As a result, the interface associated with these alarm input and control output ports is via a 10 way connector. For example, connector J8 can be a Molex connector of KK type 2.54 mm pitch header with friction lock (Molex Part No. 22-23-2101). Table 4 shows the connector pinout.

TABLE 4

| Connector Ref | Function | Signal type |
|---|---|---|
| J8-1 | +24 V | Power Supply |
| J8-2 | Damper | +24 V Damper Control |
| J8-3 | Smoke Alarm | Alarm contact input |
| J8-4 | Hydrogen Alarm | Alarm contact input |
| J8-5 | AC Supply 1 | Alarm contact input |
| J8-6 | AC Supply 2 | Alarm contact input |
| J8-7 | 0 V | Power/logic 0 V |
| J8-8 | AC inhibit Common | Form C Common |
| J8-9 | AC inhibit NO | Form C NO |
| J8-10 | AC inhibit NC | Form C NC |

Furthermore, the controller 500 includes a plurality of alarm output ports 575 each through an isolated Form C relay contact to couple with the microprocessor 501. In one embodiment, the controller 500 is fitted with five isolated Form C relay contact alarm outputs. The common of each of the alarm outputs is connected to a single point. The Form C (normally open) NO contact and (normally closed) NC contact of each alarm relay coil are available for connection to a corresponding external device. Each relay coil is characterized by its capability of switching power up to 500 mA at 30V DC. In a specific embodiment, the alarm output ports 575 include functions of a general alarm output, a smoke alarm output, a hydrogen alarm output, an over-temperature alarm output, and a filter alarm output.

The general alarm output is triggered to indicate a blower failure (for example, a blower has stopped or failed to reach a predefined percentage of its target speed) and a thermistor failure (when thermistor has open or short circuit), or a DC supply failure (when DC supply of the system has dropped below a predefined voltage). The relay coil associated with the general alarm output is directly controlled from the microprocessor 501 and is typically energized in the no-alarm condition so that an alarm (associated with one of above three failures) output will be given in the event of a total power failure to the controller PCB or a failure in the controller itself.

The smoke alarm output provides an isolated output depending on a smoke alarm input signal from the smoke sensor connected to the microprocessor 501. In one embodiment, the relay coil associated with the smoke alarm output is energized during alarm condition, but open in normal condition.

The hydrogen alarm output provides an isolated output depending on a hydrogen alarm input signal from the hydrogen sensor connected to the microprocessor 501. In one embodiment, the relay coil of the hydrogen alarm output is energized during alarm condition, but open in normal condition.

The over-temperature alarm output provides an isolated output depending on a temperature measured inside the shelter and a set point defined in the functionality specification of the microprocessor 501. In one embodiment, the relay coil of the over-temperature alarm output is energized during alarm condition, but open in normal condition.

The filter alarm output provides an isolated output depending on an input signal from a pressure switch 580 connected to the microprocessor 501 for detecting if a filter arrangement associated with the blowers of the direct air cooling system is normal or abnormal. In one embodiment, the relay coil of the filter alarm output is energized during alarm condition, but open in normal condition.

In a specific embodiment, the relay contact alarm outputs are interfaced with the microprocessor 501 via a 12 way connector. For example, the connector, namely J9, can be a Molex 12 way KK type 2.54 mm pitch header with friction lock connector (Molex Part No. 22-23-2121). Table 5 shows an exemplary connector pinout.

TABLE 5

| Connector Ref | Function | Signal type |
|---|---|---|
| J9-1 | Alarm Common | Common Signal |
| J9-2 | Smoke Alarm | Normally Open Contact |
| J9-3 | Smoke Alarm | Normally Close Contact |
| J9-4 | Hydrogen Alarm | Normally Open Contact |
| J9-5 | Hydrogen Alarm | Normally Close Contact |
| J9-6 | Over Temp Alarm | Normally Open Contact |
| J9-7 | Over Temp Alarm | Normally Close Contact |
| J9-8 | General Alarm | Normally Close Contact |
| J9-9 | General Alarm | Normally Open Contact |
| J9-10 | Filter Alarm | Normally Open Contact |
| J9-11 | Filter Alarm | Normally Close Contact |
| J9-12 | Alarm Common | Common Signal |

Furthermore, the controller 500 is configured to receive an input from a pressure switch 580 which is used monitor the pressure drop across the filter to detect if the filter is clogged. As mentioned earlier, the input signal from the pressure switch 580 is used to directly drive the filter alarm relay and a LED for indicating filter alarm (to be described later). The pressure switch 580 is driven by the on-board +5V DC supply 530. The interface between the microprocessor 501 and the pressure switch 580 is realized by a connector, namely J10. For example, a 2 way Molex KK type 2.54 mm pitch header with friction lock connector can be used (Molex Part No. 22-23-2021). Table 6 shows a pinout of the connector.

TABLE 6

| Connector Ref | Function | Signal type |
|---|---|---|
| J10-1 | Signal return | Alarm signal |
| J10-2 | Signal out | Logic +5 V |

Moreover, the controller 500 includes an on-board programming/test port 590 and a communications port 595 associated with the microprocessor 501. In one embodiment, the on-board programming/test port 590 is an In Circuit Serial Programming (ICSP) port which allows the flash memory in the microprocessor 501 to be programmed or reprogrammed after the controller 500 has been assembled. The capability of reprogramming with an appropriate programmer facilitates the production programming of the microprocessor 501 and also facilitates update of the program at a later date when necessary. This ICSP port 590 also is used for easy access to the +5V DC supply 530 and 10.5V DC supply for production testing (but not using ICSP). The interface between the on-board programming/test port 590 and the microprocessor 501 can be established via a 6 way connector, namely J11. For example, the connector can be a Molex KK type 2.54 mm pitch header friction lock connector (Molex Part No. 22-23-2061). Table 7 shows an exemplary connector pinout.

TABLE 7

| Connector Ref | Function | Signal type |
|---|---|---|
| J11-1 | MCLR | Master Clear |
| J11-2 | Logic +Ve supply | Logic 5 V Supply |
| J11-3 | Logic 0 V | Logic 0 V Return |
| J11-4 | PGC | Program Clock |
| J11-5 | PGD | Program Data |
| J11-6 | +10.5 V Supply | 10.5 V Supply (for production test) |

In another embodiment, the communications port 595 allows the controller 500 to be connected via an adaptor to the RS232 type port or USB type port of a personal computer. The communications port 595 is typically used for production testing of the system which is managed by the controller 500. The communications port 595 also can be set to broadcast performance and status information during normal operation and can be used for performance analysis. The interface to the system through the communications port 595 can be established via a connector, namely J12. For example, the connector J12 can be a 3 way Molex KK type 2.54 mm pitch friction lock header connector (Molex Part No. 22-23-2031). Table 8 shows an exemplary pinout for this connector.

TABLE 8

| Connector Ref | Function | Signal type |
|---|---|---|
| J12-1 | TX | Data Out |
| J12-2 | RX | Data In |
| J12-3 | Logic 0 V | Logic Return |

In a specific embodiment, the controller 500 also includes a plurality of LED displays 577 coupled with the microprocessor 501. These LED displays 577 are triggered by the plurality of relay contact alarm outputs 575 to show different colored light. In one example, the controller 500 is fitted with seven 5 mm diameter round LED's which will be visible through an aperture on the front of the fan tray's sheet metal structure (e.g., blower subsystem 300 in FIG. 3B). In one implementation, these LEDs are mounted on the PCB of the controller 500. FIG. 5B shows three-angle views of the controller built on a PC board according to an embodiment of the present invention. Of course, there can be many variations, alternatives, and modifications in terms of the layout of various controller components. This diagram is merely an illustration and should not limit the scope of the claims herein. For example, the controller 120 installed in the direct air cooling system 100 shown in FIG. 1 or 300 shown in FIG. 3B is the same as the controller 500 described in above paragraphs. As shown, the controller 500 is built on a printed circuit board (PCB) wherein some input/output interface devices are marked. For example, the input/output interface devices includes the connectors J1 through J12 and several LEDs (LED1 through LED7). In particular, these LED's include the following functions. LED1 is a status LED with bi-color RED/GREEN display linked with the general alarm relay. Green color is indicated when the direct air cooling system us powered up and operating normally. Red color indicator can further include continuous red light and flashing red light for different alarm events with different priorities. LED2 is a filter alarm LED which shows single color RED only in the event of an alarm. LED3 is over-temperature LED used for indicating the over-temperature alarm. LED4 and LED5 are respective smoke alarm LED and hydrogen alarm LED. Each of them is a single color LED normally off and in red light when alarming. LED6 is an AC inhibit LED used for indicating an inhibited A/C system with AMBER light but off when the A/C system is not inhibited or enabled. LED7 is an AC power fail alarm LED showing single RED color in the event of an alarm but off during normal operation.

Figure 6A:
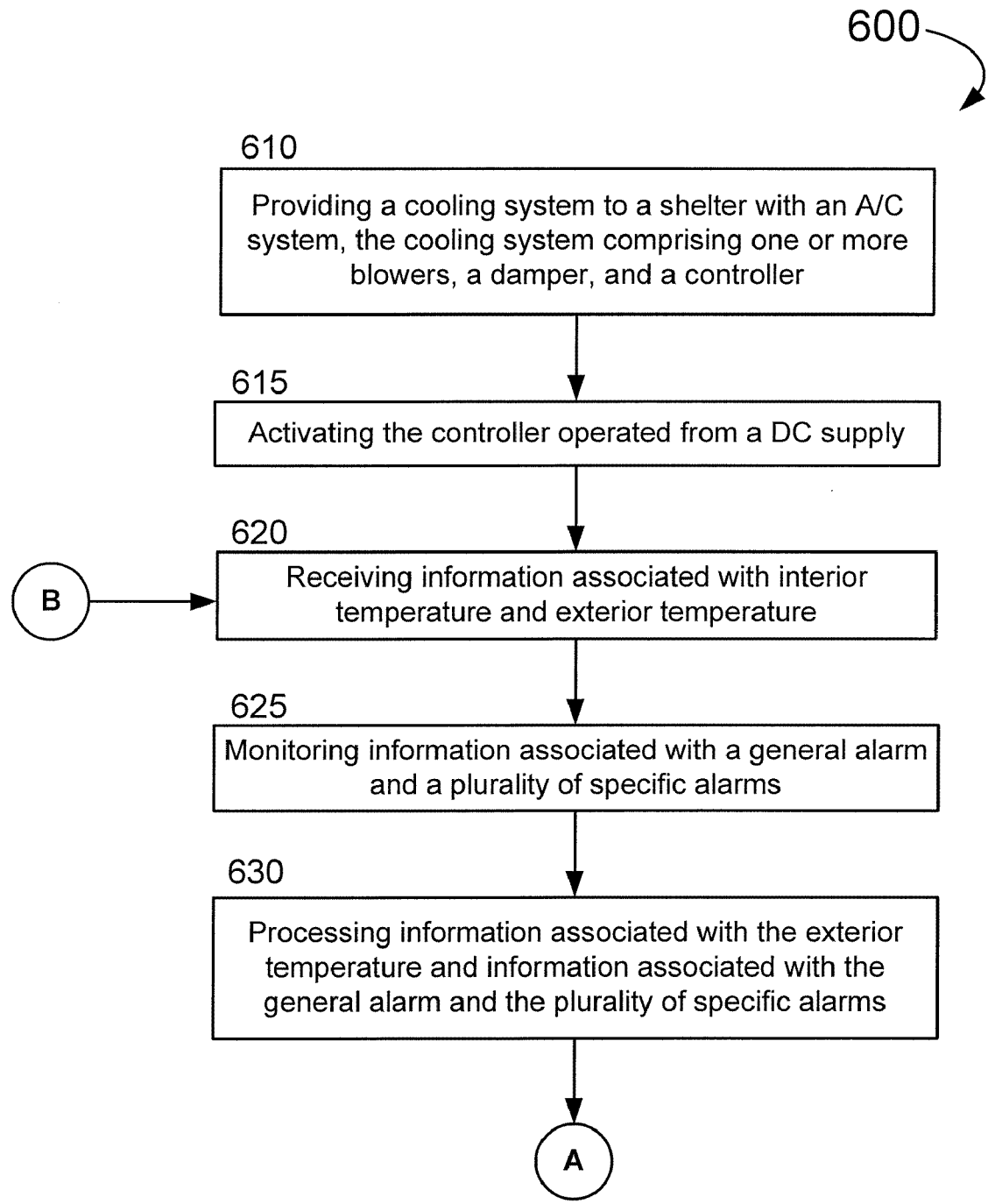
FIGS. 6A and 6B show a simplified flow chart outlining a method of providing controlled cooling for an outdoor shelter according to an embodiment of the present invention.
Figure 6B:
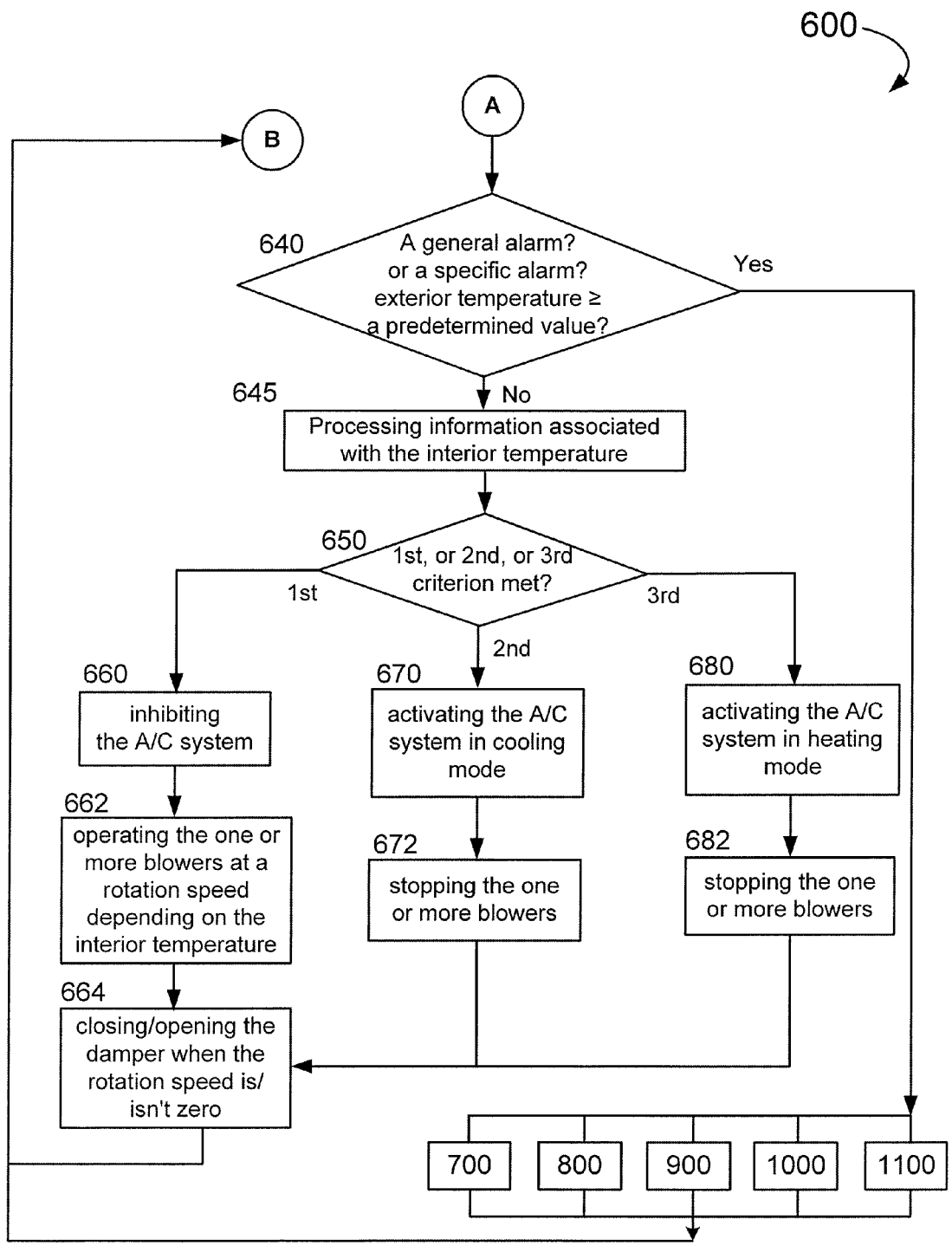

Alternatively, Embodiments of the present invention disclose a method for providing direct air cooling of electrical equipment operated within outdoor shelters supplemental to an existing air conditioning (A/C) system. In one embodiment, a simplified flow chart of the control method is illustrated in FIGS. 6A and 6B for providing a controlled thermal management for an outdoor shelter with the existing A/C system. This diagram is merely an illustration and should not limit the scope of the claims herein. One of skilled in the art should recognize many alternatives, variations, and modifications. As shown, a method 600 includes following processes:

Process 610: Providing a cooling system to a shelter with an A/C system, the cooling system comprising one or more blowers, a damper, and a controller;

Process 615: Activating the controller operated from a DC supply;

Process 620: Receiving information associated with an interior temperature and an exterior temperature;

Process 625: Monitoring information associated with a general alarm and a plurality of specific alarms;

Process 630: Processing information associated with the exterior temperature and information associated with the general alarm and the plurality of specific alarms;

Process 640: Determining whether a general alarm is triggered, or one or more specific alarms are triggered, or exterior temperature is greater than a predetermined value;

Process 645: If none of above occurs, processing information associated with the interior temperature;

Process 650: Determining whether a first criterion, or a second criterion, or a third criterion associated with the interior temperature is satisfied;

Process 660: If the first criterion is satisfied, inhibiting the A/C system; then Process 662: Operating the one or more blowers at a rotation speed depending on the interior temperature; then Process 664: Closing/Opening the damper as the rotation speed of one or more blowers is/isn't zero;

Process 670: If the second criterion is satisfied, activating the A/C system in cooling mode; then Process 672: Stopping the one or more blowers;

Process 680: If the third criterion is satisfied, activating the A/C system in heating mode; then Process 682: Stopping the one or more blowers;

Subsequently, the method 600 requires to perform, after each of the Process 672 and Process 682, the Process 664, followed by rerouted back to the Process 625 again in a closed loop.

The above sequence of processes provides a method according to an embodiment of the present invention. Other alternatives can also be provided where processes are added, one or more processes are removed, or one or more processes are provided in a different sequence without departing from the scope of the claims herein.

In one example, the cooling system used in the method 600 is the same as the direct air cooling system 100 shown in FIG. 1 and 300 shown in FIGS. 3A and 3B. Following the method 600, the cooling system is provided for mounting to a shelter at the Process 610. The cooling system includes one or more blowers configured to be mounted on an interior region of an shelter door, a filter arrangement configured to be mounted at an air inlet of the one or more blowers, and a damper arrangement configured to be mounted else where at an air exhaust region of the shelter. The cooling system further includes a controller. In one implementation, the controller is a microprocessor based controller operated from a DC supply. The microprocessor features at least a first analog input, a second analog input, a plurality of alarm inputs, one or more first control outputs, a second control output, and a third control output. In particular, the controller is the same controller 500 including microprocessor 501 shown in FIGS. 5A and 5B.

The method 600 further includes a process of activating the controller by starting up DC power from the DC supply (Process 615) to make the microprocessor ready for executing preprogrammed control routines. In addition, the activation process involves an activation of a general alarm relay coil and activations of a plurality of sensing devices associated with the controller. For example, a general alarm relay coil is activated and a two-color LED indicates green during a start up period (approximate 5 seconds). Among the plurality of sensing devices, a first thermistor and a second thermistor are activated for temperature measurements. Other sensing devices includes a smoke sensor, a hydrogen sensor, a pressure switch, one or more AC power monitoring modules, DC voltage monitor, and the like.

Subsequently, the controller starts working with the activated plurality of sensing devices. In particular, at the Process 620, the microprocessor is receiving information associated with an interior temperature and from the first analog input and information associated with an exterior temperature from the second analog input. In one implementation, the first analog input is a port called Input Temp 1 connected to the microprocessor for delivering information associated with the interior temperature for the controller. Similarly, the second analog input is a port called Input Temp 2 connected to the microprocessor for delivering information associated with the exterior temperature for the controller. This process, in one implementation, is to start executing a closed-loop PWM control routine for the cooling system. In particular, the microprocessor, in response to at least the received information associated with the interior and exterior temperatures, should generate adequate control signals for controlling the speed of the one or more blowers. At the process 625, the controller also monitors information associated with the general alarm and a plurality of specific alarms received through the plurality of alarm inputs. In one implementation, the microprocessor is able to adjust the control signals based on received information associated with various alarms indicating abnormal operational status of the cooling system.

At the Process 630 following the previous Processes 620 and 625, the microprocessor firstly carries out a step for processing the received information associated with the exterior temperature and information associated with the general alarm and the plurality of specific alarms. In one embodiment, the cooling system sets to prioritize certain operational and environmental conditions to generate adequate control signals. For example, a general alarm involving a blower failure, or thermistor failure, or DC supply fault, has high priority and needs to be cleared first before performing rest operations. In certain exceptional case, during the starting up period, if the interior temperature is such that the one or more blowers would normally be stopped, the one or more blowers will start up and run during the start up period to allow installation engineers to establish that the blower is working normally. There is about 30 seconds delay to trigger general alarm to prevent the controller from issuing alarms during the blower starting up period. After the start up period they will be turned off or work to follow preprogrammed control routines. Additionally, some specific alarms including smoke alarm and hydrogen alarm and the shelter's exterior temperature are determining factors on how the various control signals are formulated for controlling the cooling system. More details about the control method at various environmental and operational conditions can be found below.

Based on the Process 630, the microprocessor is able to determine (at the Process 635) whether the exterior temperature is lower than a predetermined value, or whether a general alarm or one or more specific alarms is triggered.

In case that a negative result is obtained at the Process 640, then the microprocessor is to execute the next Process 645 for processing information associated with the interior temperature. Based on this process, the microprocessor is able to determine (at the Process 650) whether one of the three criteria associated with the interior temperature is satisfied. The three criteria simply corresponds to three predetermined temperature ranges. If the interior temperature measured by the first thermistor, determined by the microprocessor, falls into one particular range, a particular criterion is satisfied. Accordingly based on the programmed routine designed for the particular temperature, the controller generates adequate control signals to inhibit or re-activate the A/C system, to control a speed of each blower, and to open/close the damper whenever the speed of each blower isn't/is zero.

In an event when the first criterion is satisfied, Process 660 will be executed. In one embodiment, the first criterion is defined as limiting the interior temperature within a temperature window between a lower temperature limit and a higher temperature limit. For example, if the interior temperature is within a range of 0 Deg C. to 38 Deg C., the first criterion is satisfied. At Process 660 the microprocessor provides a control signal to inhibit the operation of the A/C system in this condition. Then (or essentially at the same time), Process 662 is executed to provide one or more control signals respectively to control speed of the blowers. Specific speed control depends on a specific value of the interior temperature detected by the first thermistor which can be installed near the one or more blowers at the interior side of the shelter. Process 664 (also can occur at substantially the same time) is executed to open the damper when the one or more blowers are blowing air into the shelter while to close the damper when the one or more blowers are stopped (for any reason).

In one example, as the interior temperature is below 7 Deg C., all blowers will be turned off. If the interior temperature is rising (as the electrical equipment in operation gradually heats up the shelter) to 10 Deg C., the controller may decide to start turn the blowers on at a speed of a certain speed, for example, about 1080 rpm. As the interior temperature further increases above 10 Deg C., the average speed of the blowers will increase linearly to reach a higher speed, for example, up to about 3000 rpm, at about 35 Deg C. In one embodiment, at temperature above 35 Deg C. but still below the higher temperature limit for the first criterion, the blowers will operate at the full speed of 3000 rpm unless stopped by other conditions including unsatisfied first criterion and some alarming situations.

If the interior temperature increases (as the electrical equipment keeps its operation) above the higher temperature limit, for example 39 Deg C., the second criterion becomes true. The Process 670 would be triggered in this condition. In particular, assuming no AC power supply alarm input is received, the controller would providing a control signal to remove the inhibit of the A/C system to enable it to take over the cooling of the shelter. In other words, Process 672 is executed at a substantially same time to stop the blowers. In fact, this is the condition that the shelter is cooled under conventional way. However, if the interior temperature measured by the first thermistor drops from a temperature above the higher temperature limit to a temperature below that limit, for example 35 Deg C. or lower, then the controller will send a control signal to inhibit the A/C system again and reestablish direct air cooling by turning on the blowers at the proper speed depending on the interior temperature.

If the interior temperature is below the lower temperature limit set for the first criterion, the third criterion is satisfied. In this condition, the Process 680 is triggered. At this process the controller is providing a control signal to remove the inhibit of the A/C system to allow it to operate in its heating mode to heat up the shelter. Accordingly, Process 682 is executed to stop the blowers. Usually, this occurs during a cold soak recovery process after an extended power failure at low temperature environment. However, it will disable the A/C system again once the interior temperature is above certain value above 0 Deg C., for example 5 Deg C.

In either situation above, the damper arrangement associated with the direct air cooling system is controlled in response to the operation status of the blowers. In one embodiment, whenever, the blower is turned on, the damper arrangement will be instructed to open by a control signal sent by the controller. Whenever, the blower stops, the damper arrangement will be instructed to close by another control signal sent by the controller. In another embodiment, some events associated with on/off status of the blowers are related to one or more alarming events.

Figure 7:
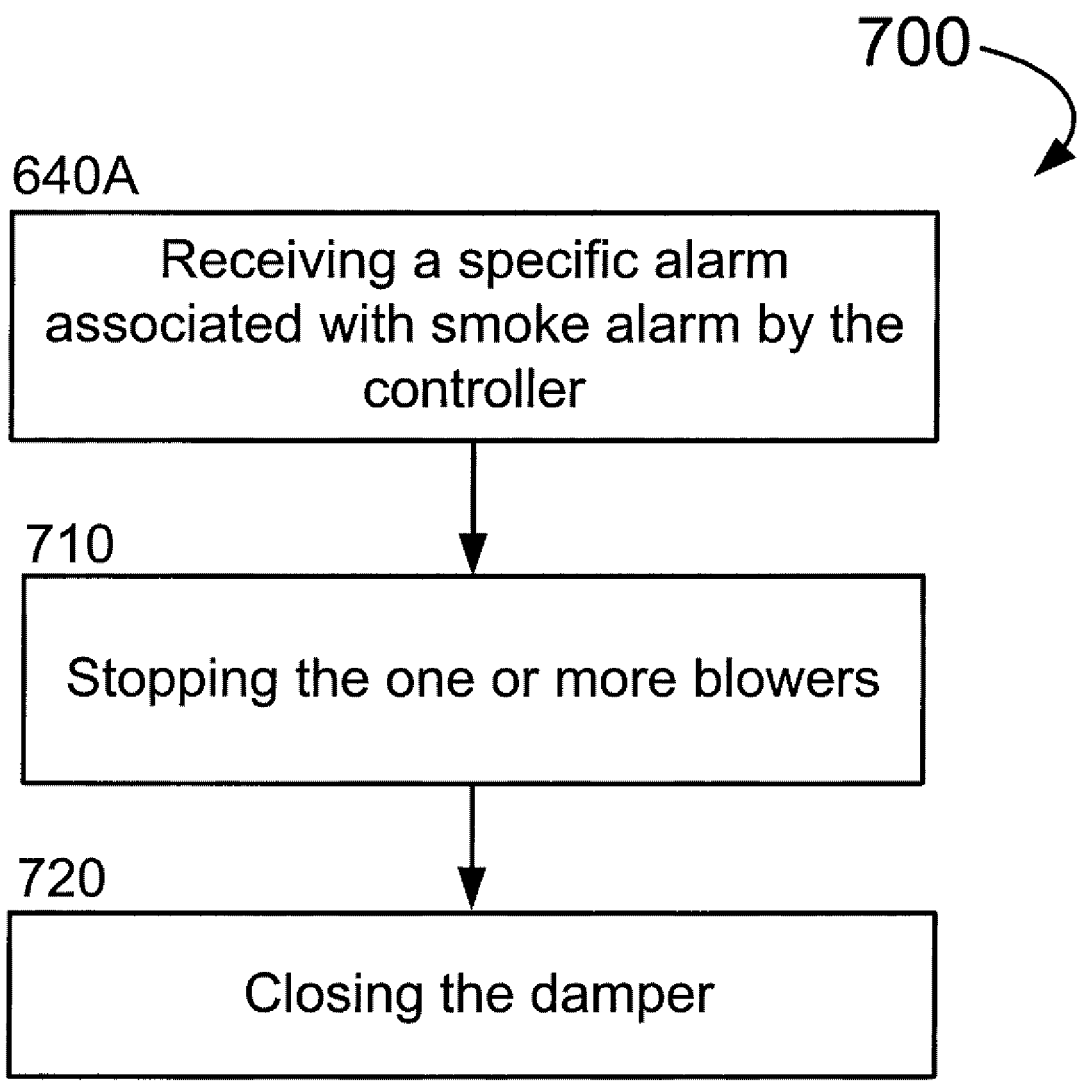
FIGS. 7-11 each is a simplified flow chart showing a method for providing controlled cooling for an outdoor shelter according to an alternative embodiment of the present invention.

Referring back to FIG. 6, in case that the controller receives a positive result at the Process 640, i.e., either a general alarm is triggered, or one or more specific alarms is received by the microprocessor, or simply the exterior temperature measured by the second thermistor is greater than a predetermined value, the method 600 will move on to perform one of following processes: Process 700 through 1100, depending on the specific conditions. FIG. 7 is a simplified flow chart showing a method for providing controlled cooling for an outdoor shelter according to an alternative embodiment of the present invention. In this specific condition, at the process 640A one specific alarm, a smoke alarm, is triggered (for example in case of fire). Then, the microprocessor generates one or more control signals to turn off corresponding blowers (Process 710) and close the exhaust damper (Process 720) to minimize the air supply (for the fire). In one embodiment, the microprocessor also energizes a contact alarm relay coil associated with the smoke alarm to generate a smoke alarm output signal which illuminates a LED in red color. Once the smoke alarm returns to normal the controller will return to normal operation (i.e., the process flow would be led back to the Process 620 and on).

Figure 8:
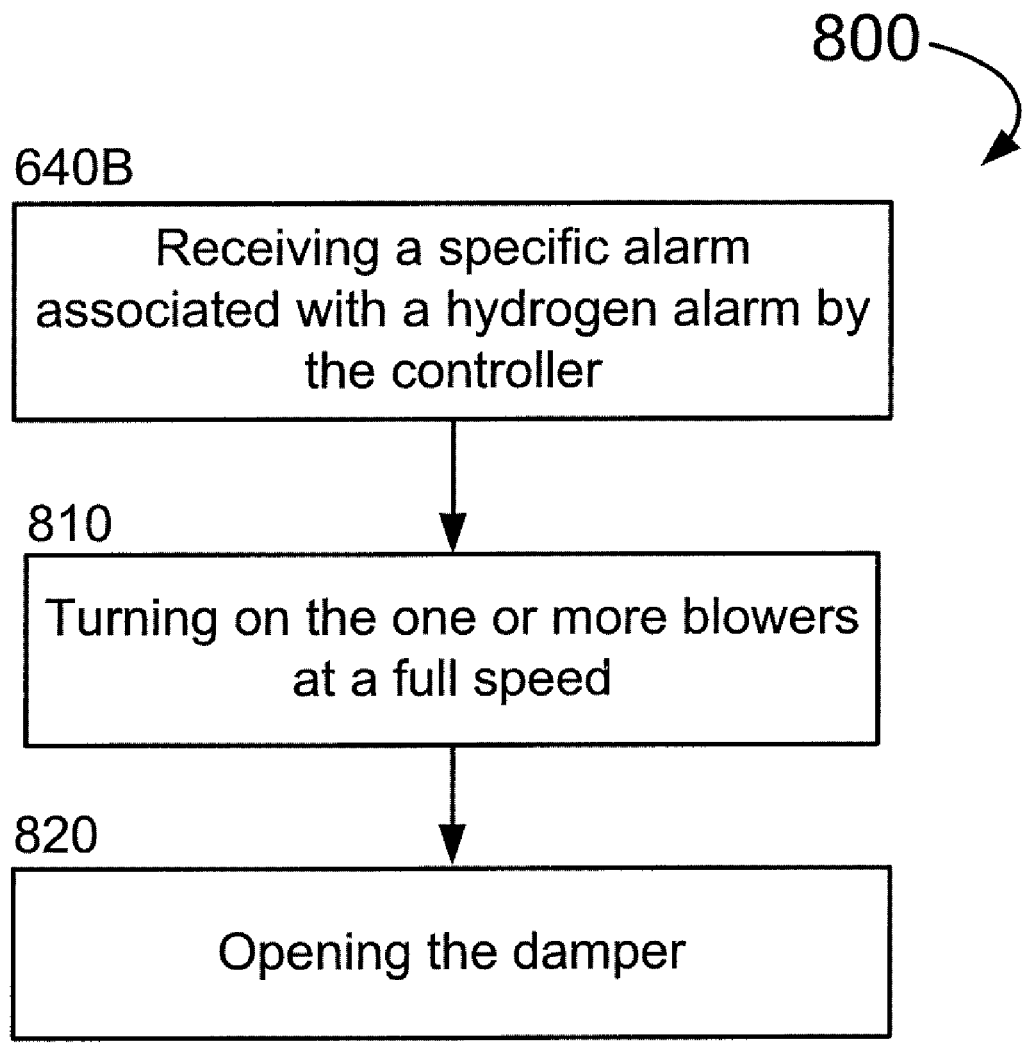

FIG. 8 is another simplified flow chart showing a method for providing controlled cooling for an outdoor shelter according to another alternative embodiment of the present invention. In the situation of another specific alarm, a hydrogen alarm, is received by the microprocessor (Process 640B), one or more control signals will be sent to the blowers to speed them up (Process 810) to drive the hydrogen out of the shelter. In one example, the blowers will be on at full speed, for example about 3000 rpm. At the same time, the exhaust damper will be kept at an open state (Process 820) (irrespective of the temperature or any other control parameter) to vent the shelter. In one embodiment, the microprocessor also energizes the contact relay coil associated with the hydrogen alarm and generate a hydrogen alarm output signal to illuminate a corresponding LED in red color.

Figure 9:
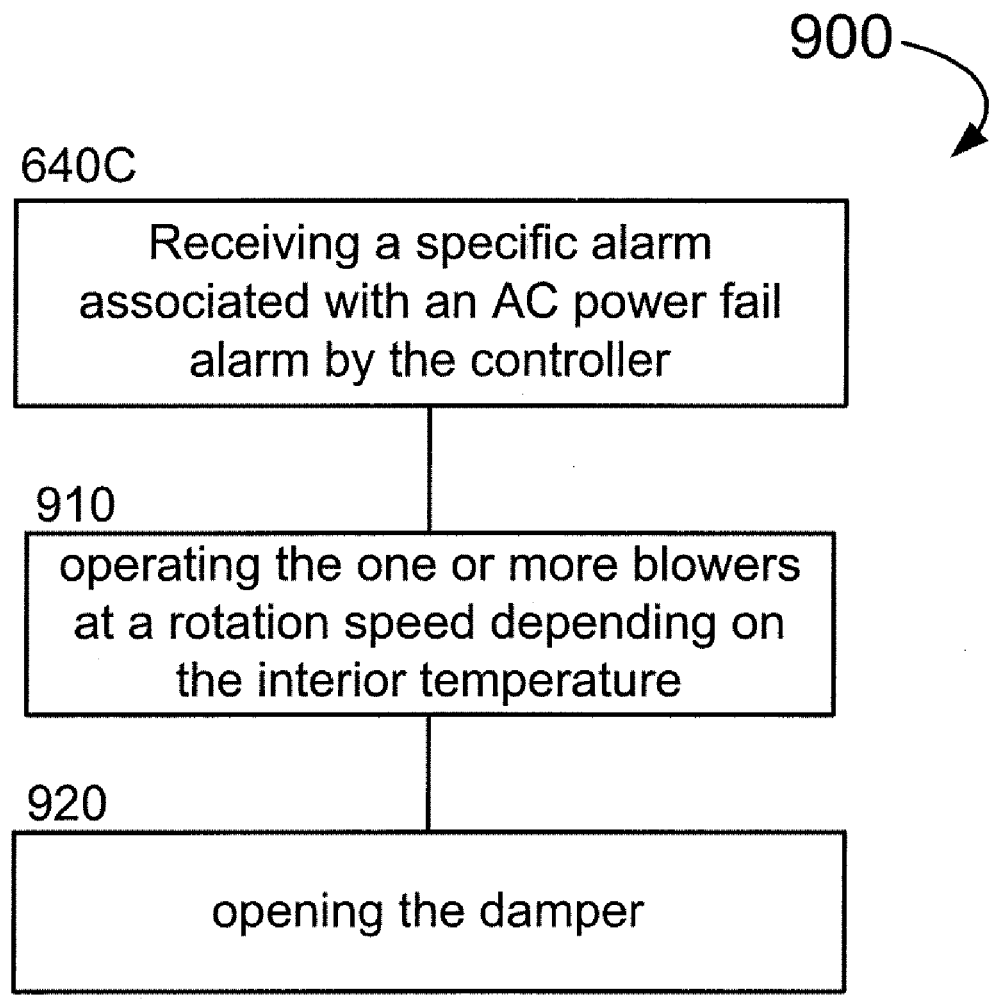

FIG. 9 is another simplified flow chart showing a method for providing controlled cooling for an outdoor shelter according to another alternative embodiment of the present invention. In this situation another specific alarm, an AC power fail alarm, is received by the microprocessor (Process 640C). Usually, two redundant AC power monitoring inputs are installed in the cooling system. If the controller detects an AC power fail on both the AC power monitoring inputs, it will operate the blowers (or turn them on if they have been off) (Process 910) at any temperature condition. At the same time, the damper should be at an open state (Process 920) and an AC power fail alarm LED will be illuminated in red color.

Figure 10:
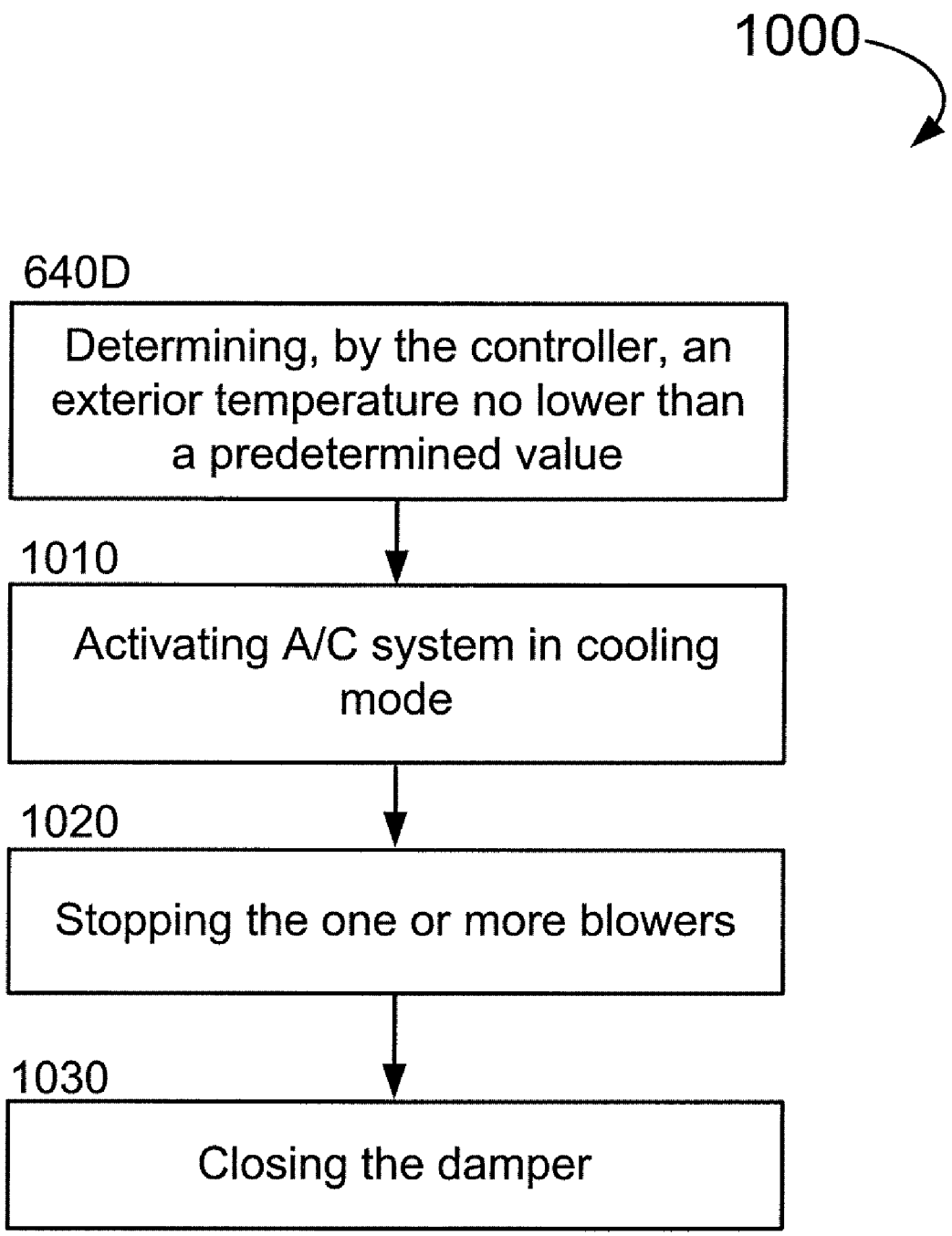

FIG. 10 is yet another simplified flow chart showing a method for providing controlled cooling for an outdoor shelter according to another alternative embodiment of the present invention. This is a situation that the microprocessor receives an Input Temp 2 signal indicating that the exterior temperature is greater than a predetermined value (Process 640D). In one example, the predetermined temperature value is 27 Deg C. for outdoor telecom shelters. Thus the controller will stop the blowers (Process 1010) and enable the A/C system (Process 1020) to cool the shelter until the exterior temperature cools down. Of course, the damper will be kept at a closed state (Process 1030) during that period when the conventional A/C system is running. If the exterior temperature drops below the predetermined value, for example at 26 Deg C. or lower, the direct air cooling system will again replace the A/C system to provide cooling for the shelter.

Figure 11:
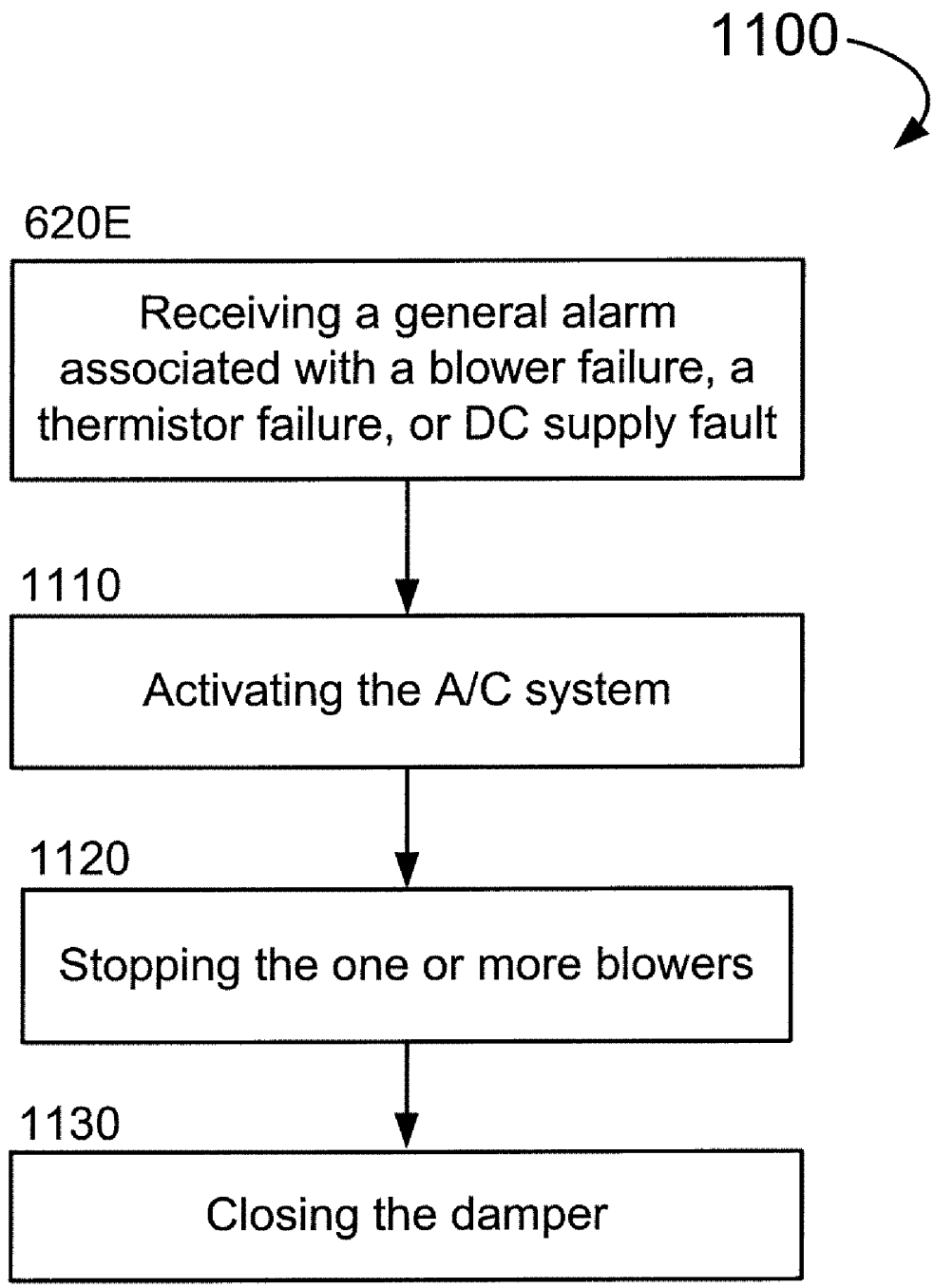

FIG. 11 is still yet another simplified flow chart showing a method for providing controlled cooling for an outdoor shelter according to another alternative embodiment of the present invention. At Process 640E, a general alarm is triggered. In one embodiment, the general alarm includes a blower fail alarm. If the speed of any blower drops below 70% of the speed of the other blowers then a general alarm will be triggered by de-energizing the general alarm relay and a corresponding general alarm LED will be changed to continuous red color. The controller will turn off all blowers (Process 1110) and also remove the inhibit of the A/C system to allow it to take over the cooling of the shelter (Process 1120) unless there is also an AC power fault in which case the controller will operate the available blowers at maximum available speed. In one embodiment, the controller may notify the end user or a remote manager to send a technician to repair the blower that is in trouble.

In another embodiment, the general alarm includes a thermistor fail alarm. In particular, if the thermistor connected to either first analog input or the second analog input is detected as either being open or short circuited then a general alarm is triggered by de-energizing the general alarm relay coil. Correspondingly in one implementation, the general alarm LED is changing color to flashing red color. In this case, the controller will also remove the inhibit to the A/C system to allow it to take over the cooling of the shelter unless there is also an AC power failure. If there is an AC power failure, i.e., the AC power fail alarm has been triggered, the DC powered controller will keep on operating the one or more blowers at full speed to draw cool air from exterior into the shelter.

In yet another embodiment, the general alarm also includes a DC supply fail alarm. The controller will monitor the DC supply voltage to the direct air cooling system and has been programmed to take action at different supply voltage. In one example, if the DC supply to the controller drops below 40V the controller will turn off all the blowers and close the damper to minimize the deep discharge of the batteries. The controller will also issue a general alarm in this condition. Thus Process 1100 will be executed. The controller will resume normal function when the DC supply voltage to the controller reaches 42.5V.

In the event that there are multiple alarms priority of the general alarms must be set. In one example, the controller will prioritize the alarm indications as follows. Priority 1 (highest priority): Blower Fail, indicating by a continuous RED LED;

Priority 2: Thermistor Fail, indicating by a flashing RED LED. In one embodiment, there is an about 30 seconds delay in blower alarms to prevent the controller from issuing alarms during the time that blowers are starting up.

There are some alarm situations that no immediate actions on either the operation of blower/damper combination or inhibit/activation of A/C system. For example, if the controller detects an input alarm signal from a pressure sensor (or a pressure switch) the controller will energize a filter alarm relay and illuminate the corresponding filter alarm LED in red color. The controller may also sent a message through its communication port to remote manager to make a request of filter change. Similarly, if the temperature detected by the thermistor connected to Input Temp 1 reaches 44 Deg C. in reading, the controller will indicate an over-temperature alarm via an over-temperature alarm relay and turn the corresponding LED to be illuminated RED. In this situation, the cooling of the shelter has been taken over by the A/C system (assuming no AC power fault). However, certain message can be sent to remote manager through the controller about the status of the shelter. The over-temperature alarm will be turned off if the temperature drops to 42 Deg C., all other functions of the controller will remain as normal.

Many benefits can be achieved by embodiments of the present invention. Certain embodiments of the invention provide a simple addition of a direct air cooling system to existing telecommunications shelters by mounting the fan tray on the door of the shelter. The damper arrangement is conveniently mounted over one of the existing cable ducts in order to allow the field upgrade of the shelter. This structural design of the direct air cooling system keeps the structural integrity of the existing telecom shelter while providing a minimally invasive rework event. Some embodiments of the present invention utilizing the direct air cooling to provide a supplemental thermal management with significant amount of energy saving and reduce overall system operating cost. Because for quite portion of time period, the operation of existing A/C system associated with the shelter are inhibited and the shelter is cooled by the direct air cooling system based on embodiments of the present invention. In a specific embodiment, in the event of a power failure, the direct air cooling system can continue to operate normally from the battery back up allowing the entire shelter to operate for as long as there is power in the battery. Comparing to conventional shelter with A/C system only, the operation of the equipment within the shelter may quickly become overheated since no alternate cooling is provided.

It is also understood that the examples and embodiments described herein are for illustrative purposes only and that various modifications or changes in light thereof will be suggested to persons skilled in the art and are to be included within the spirit and purview of this application and scope of the applied claims.

What is claimed is:

1. A system for providing alternative cooling, in addition to an air conditioning (A/C) system, to a cabinet housing electrical equipment, the system comprising:
   a blower subsystem including one or more blowers for drawing air from outside of the cabinet into the cabinet, the blower subsystem comprising a bank of blower units and a path of airflow from outside of the cabinet into the cabinet that is absent an evaporator element of an A/C unit;
   a damper subsystem including a louver arrangement for controlling air exhaust;
   a controller operated from a DC supply, the controller including a microprocessor having at least a first analog input, a second analog input, a plurality of alarm inputs, one or more first control outputs, a second control output, and a third control output;
   wherein:
      the first analog input connects to a first thermistor to measure a first temperature inside the cabinet;
      the second analog input connects to a second thermistor to measure a second temperature outside the cabinet;
      the third control output connects to the A/C system for inhibiting or re-activating the A/C system based on at least the first temperature and the second temperature,
      the one or more first control outputs connect to the blower subsystem for respectively operating the one or more blowers based on at least the first temperature when the A/C system is inhibited or stopped for any reason;
      the second control output connects to the damper subsystem for opening/closing the louver arrangement when the one or more blowers are operating/stopped.

2. The system of claim 1 wherein the one or more blowers comprise a two-channel configuration each channel having two blowers, each blower being subjected a closed-loop pulse width modulated (PWM) speed control by modulating voltage from the DC supply.

3. The system of claim 1 wherein the plurality of alarm inputs are respectively connected to a plurality of sensing devices to monitor environment conditions and operation status of the electrical equipment within the cabinet.

4. The system of claim 3 wherein the plurality of sensing devices include a smoke sensor for generating a smoke alarm input signal to the controller when alarming, the smoke alarm input signal causing the controller to respectively stop the one or more blowers through the one or more first control outputs.

5. The system of claim 3 wherein the plurality of sensing devices further include a hydrogen sensor for generating a hydrogen alarm input signal to the controller when alarming, the hydrogen alarm input signal causing the controller to respectively operate the one or more blowers at a predetermined maximum rotation speed.

6. The system of claim 3 wherein the plurality of sensing devices further include at least one AC power monitoring module for generating an AC fail alarm input signal when detecting power failure of each A/C system unit, the AC fail alarm input signal causing the controller to respectively turn on the one or more blowers at a rotation speed depending on the first temperature.

7. The system of claim 1 further comprises a filter arrangement disposed at an air inlet region of the blower subsystem and coupled to the microprocessor through a pressure switch, the filter arrangement being associated with a filter alarm input signal when a pressure drop across the filter arrangement is detected to be greater than a predetermined value by the pressure switch.

8. The system of claim 1 wherein the microprocessor further has a plurality of alarm outputs coupled with a plurality of alarm display devices.

9. The system of claim 8 wherein each of the plurality of alarm outputs includes an isolated Form C relay contacts having a common port, a normally open (NO) contact, and a normally closed (NC) contact.

10. The system of claim 9 wherein the plurality of alarm outputs include a general alarm relay normally energized to a corresponding NO contact and de-energized to a corresponding NC contact to output a general alarm output signal in an event of at least a failure of one blower or the first thermistor or the second thermistor or the DC supply.

11. The system of claim 10 wherein the plurality of alarm display devices comprise a bi-color LED display in response to the general alarm output signal.

12. The system of claim 9 wherein the plurality of alarm outputs further include a smoke alarm relay, a hydrogen alarm relay, an over-temperature alarm relay, and a filter alarm relay, each being normally energized to a corresponding NC contact and de-energized to a corresponding NO contact when alarming to output a specific alarm output signal.

13. The system of claim 12 wherein the plurality of alarm display devices further comprise a single-color LED display for each of corresponding specific alarm output signal.

14. The system of claim 1 wherein the controller further comprises an In Circuit Serial Programming port allowing programming and reprogramming of a microprocessor flash memory and production testing.

15. The system of claim 1 wherein the controller further comprises a communications port allowing the controller being connected to a personal computer via an adaptor to RS232 port or USB port.

16. The system of claim 1 wherein the controller further comprises an EMC filter between the DC power input and rest portion of the controller.

* * * * *